US008711645B2

(12) United States Patent  (10) Patent No.: US 8,711,645 B2
Chakravarty  (45) Date of Patent: Apr. 29, 2014

(54) VICTIM PORT-BASED DESIGN FOR TEST AREA OVERHEAD REDUCTION IN MULTIPORT LATCH-BASED MEMORIES

(75) Inventor: Sreejit Chakravarty, Mountain View, CA (US)

(73) Assignee: LSI Corporation, San Jose, CA (US)

( * ) Notice: Subject to any disclaimer, the term of this patent is extended or adjusted under 35 U.S.C. 154(b) by 211 days.

(21) Appl. No.: 13/431,614

(22) Filed: Mar. 27, 2012

(65) Prior Publication Data

US 2013/0258786 A1  Oct. 3, 2013

(51) Int. Cl.
  G11C 29/50  (2006.01)
  G11C 11/401  (2006.01)
  G11C 29/02  (2006.01)
  G11C 29/34  (2006.01)

(52) U.S. Cl.
  CPC .............. *G11C 29/50* (2013.01); *G11C 11/401* (2013.01); *G11C 29/02* (2013.01); *H05K 999/99* (2013.01); *G11C 29/34* (2013.01)
  USPC .................. 365/201; 365/230.08; 365/230.05

(58) Field of Classification Search
  CPC ...... G11C 29/50; G11C 11/401; G11C 29/02; G11C 29/34; H05K 999/99
  USPC ................................. 365/201, 230.08, 230.05
  See application file for complete search history.

(56) References Cited

U.S. PATENT DOCUMENTS

| | | | |
|---|---|---|---|
| 5,612,923 | A | 3/1997 | Gibson et al. |
| 5,734,613 | A | 3/1998 | Gibson |
| 5,796,745 | A | 8/1998 | Adams et al. |
| 5,896,330 | A | 4/1999 | Gibson |
| 6,216,241 | B1 | 4/2001 | Fenstermaker et al. |
| 6,288,969 | B1 | 9/2001 | Gibbins et al. |
| 6,865,701 | B1 | 3/2005 | Youngs et al. |
| 7,222,272 | B2 | 5/2007 | Takazawa et al. |
| 7,450,459 | B2 | 11/2008 | Park |
| 7,701,800 | B2 | 4/2010 | Chung et al. |
| 7,787,322 | B2 | 8/2010 | Im et al. |
| 7,808,851 | B2 | 10/2010 | Hur et al. |
| 2007/0070778 | A1 | 3/2007 | Do |
| 2007/0086253 | A1 | 4/2007 | Gerowitz et al. |
| 2009/0059696 | A1* | 3/2009 | Park ............................. 365/200 |

* cited by examiner

*Primary Examiner* — Jason Lappas
(74) *Attorney, Agent, or Firm* — Otterstedt, Ellenbogen & Kammer, LLP

(57) ABSTRACT

A multiport latch-based memory device includes a latch array, a plurality of first multiplexers, and a second multiplexer. The latch array is responsive to output data from an input data register in a functional mode associated with the latch-based memory device. The plurality of first multiplexers is responsive to output data from the latch array in the functional mode. The plurality of first multiplexers is responsive to output data from the input data register in a test mode associated with the latch-based memory device. The second multiplexer selectively provides output data from the plurality of first multiplexers to the input data register in the test mode, thereby providing a data path bypassing the latch array in the test mode. Embodiments of a corresponding method and computer-readable medium are also provided.

16 Claims, 32 Drawing Sheets

FIG. 6

STEP 1:
for i=0, i<r, i++
    if (i is even)
        Wi(AA)
    else
        Wi(55)
    end
end STEP 2:
R0(AA)
for i=1, i<r, i++
    if (i is even)
        Ri(AA)
        Wi-1(AA)
    else
        Ri(55)
        Wi-1(55)
    end
end
if (r is even)
    Wr-1(AA)
else
    Wr-1(55)
end STEP 3:
if (r is even)
    Rr-1(AA)
else
    Rr-1(55)
end
for i=r-1, i>0, i--
    if (i is even)
        Ri-1(AA)
        Wi(00...0)
    else
        Ri-1(55)
        Wi(FF)
    end
end
W0(00...0)

STEP 4:
DIB0=FF
for i=1, i<r, i++
    if (i is even)
        DIBi=FF
        Ri-1=FF
    else
        DIBi=00...0
        Ri-1(00...0)
    end
end
if (r is even)
    Rr-1(FF)
else
    Rr-1(00...0)
end STEP 5:
for i=0, i<r, i++
    if (i is even)
        Ri(FF)
        Wi(FF)
    else
        Ri(00...0)
        Wi(00...0)
    end
end NOTE THAT r IS THE NUMBER OF THE WORDS IN THE ARRAY

FIG. 7B
```
OPTIONAL STEP 7(a) INSERTED BETWEEN
STEP 6 AND 7:
for i=1, i<r, i++
    Wi(FF) & Ri(FF);
    Wi(00...0)
end
```
```
OPTIONAL STEP 9(a) INSERTED BETWEEN
STEP 8 AND 9:
for i=1, i<r, i++
    Wi(00...0) & Ri(00...0);
    Wi(FF)
end
```
4*N SCAN PATTERNS; N = # WORDS IN MEMORY FOR BIT LINE LEAKAGE FAULT TEST
FIG. 8
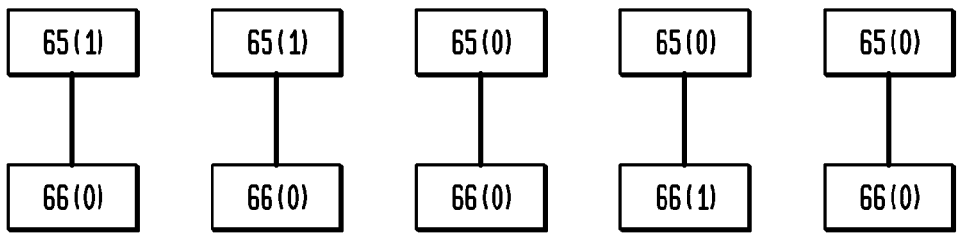
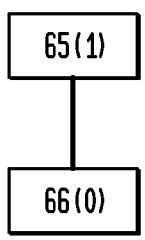 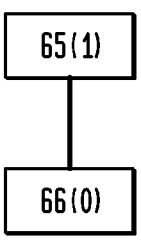 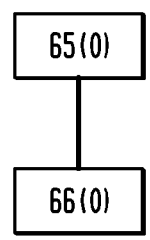 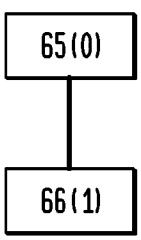

FIG. 17A

```
STEP 3:
R0(55)-read_port 2, R1(AA)-read_ports 1, 3 to 10;
W0(AA)-write_port 3, W1(55)-write_port 1, W3(55)-write_port 2, W5(55)-read_ports 1 to 10;
⋮
W5(55)-write_port 3, W0(AA)-write_port 1, W2(AA)-write_port 2, W4(AA)-read_ports 1 to 10;
for i=6, i<r, i++
    if (i is even)
        Ri(55)-read_port 2, R0(AA)-read_ports 1, 3 to 10;
        Wi-1(55)-write_port 3, W0(AA)-write_port 1, W2(AA)-write_port 2, W4(AA)-read_ports 1 to 10;
    else
        Ri(AA)-read_port 1, R1(55)-read_ports 2 to 8;
        Wi-1(AA)-write_port 3, W1(55)-write_port 1, W3(55)-write_port 2, W5(55)-read_ports 1 to 10;
    end
end
if (r is even)
    Wr-1(55)-write_port 3, W0(AA)-write_port 1, W2(AA)-write_port 2, W4(AA)-read_ports 1 to 10;
else
    Wr-1(AA)-write_port 3, W1(55)-write_port 1, W3(55)-write_port 2, W5(55)-read_ports 1 to 10;
end
```

FIG. 17B

```
STEP 3:
R0(55)-read_port 2, R1(AA)-read_ports 1, 3 to 10;
W0(AA)-write_port 3, W1(55)-write_port 1, W3(55)-write_port 2, W5(55)-read_ports 1 to 10;
W5(55)-write_port 3, W0(AA)-write_port 1, W2(AA)-write_port 2, W4(AA)-write_port 4, R0(AA)-read_ports 1 to 10;
for i=6, i<r, i++
    if (i is even)
        Ri(55)-read_port 2, R0(AA)-write_ports 1, 3 to 10;
        Wi-1(55)-write_port 3, W0(AA)-write_port 1, W2(AA)-write_port 2, W4(AA)-write_port 4, R0(AA)-read_ports 1 to 10;
    else
        Ri(AA)-read_port 1, R1(55)-read_ports 2 to 8;
        Wi-1(AA)-write_port 3, W1(55)-write_port 1, W3(55)-write_port 2, W5(55)-write_port 4, R1(55)-read_ports 1 to 10;
    end
end
if (r is even)
    Wr-1(55)-write_port 3, W0(AA)-write_port 1, W2(AA)-write_port 2, W4(AA)-write_port 4, R0(AA)-read_ports 1 to 10;
else
    Wr-1(AA)-write_port 3, W1(55)-write_port 1, W3(55)-write_port 2, W5(55)-write_port 4, R1(55)-read_ports 1 to 10;
end
```

FIG. 19A
TEST SEQUENCE FOR 8R2W

```
STEP 1:
W0(AA)-write_port 1, W1(55)-write_port 2, R1(55)-read_ports 1 to 8, VSR=1;
for i=2, i<r, i++
    if (i is even)
        Wi(AA)-write_port 1, W1(55)-write_port 2, R1(55)-read_ports 1 to 8, VSR=
1;
    else
        Wi(55)-write_port 1, W0(AA)-write_port 2, R0(AA)-read_ports 1 to 8, VSR=
1;
    end
end
```

```
STEP 2:
R0(AA)-read_port 1, R1(55)-read_ports (2 through 8), VSR=1;
W0(55)-write_port 2, W1(AA)-write_port 1, R1(AA)-read_ports 1 to 8, VSR=1;
for i=2, i<r, i++
    if (i is even)
        Ri(AA)-read_port 1, R0(55)-read_ports (2 through 8), VSR=1;
        Wi-1(AA)-write_port 2, W0(55)-write_port 1, R0(55)-read_ports 1 to 8, VSR=1;
    else
        Ri(55)-read_port 1, R1(AA)-read_ports (2 through 8), VSR=1;
        Wi-1(55)-write_port 2, W1(AA)-write_port 1, R1(AA)-read_ports 1 to 8, VSR=1;
    end
end
if (r is even)
    Wr-1(AA)-write_port 2, W0(55)-write_port 1, R0(55)-read_ports 1 to 8, VSR=1;
else
    Wr-1(55)-write_port 2, W1(AA)-write_port 1, R1(AA)-read_ports 1 to 8, VSR=1;
end
```

```
STEP 3*:
R0(55)-read_port 2, R1(AA)-read_ports 1, 3 to 8, VSR=1;
W0(AA)-write_port 1, W1(55)-write_port 2, R1(55)-read_ports 1 to 8, VSR=2;
for i=2, i<r, i++
    if (i is even)
        Ri(55)-read_port 2, R0(AA)-read_ports 1, 3 to 8, VSR=2;
        Wi-1(55)-write_port 1, W0(AA)-write_port 2, R0(AA)-read_ports 1 to 8, VSR=2;
    else
        Ri(AA)-read_port 2, R1(55)-read_ports 1, 3 to 8, VSR=2;
        Wi-1(AA)-write_port 1, W1(55)-write_port 2, R1(55)-read_ports 1 to 8, VSR=2;
    end
end
if (r is even)
    Wr-1(55)-write_port 1, W0(AA)-write_port 2, R0(AA)-read_ports 1 to 8, VSR=2;
else
    Wr-1(AA)-write_port 1, W1(55)-write_port 2, R1(55)-read_ports 1 to 8, VSR=2;
end
```

FIG. 19B
TEST SEQUENCE FOR 8R2W

STEP 4:
if (r is even)
    Rr-1(55)-read_port 3, R0(AA)-read_port 1, 2, 4 to 8, VSA=3;
    Rr-2(AA)-read_port 3, R1(55)-read_port 1,2,4 to 8, VSA=3;
    Wr-1(FF)-write_port 2, Wr-2(00)-write_port 1, VSA=3;
else
    Rr-1(AA)-read_port 3, R1(55)-read_port 1, 2, 4 to 8, VSA=3;
    Rr-2(55)-read_port 3, R0(AA)-read_port 1, 2, 4 to 8, VSA=3;
    Wr-1(00)-write_port 2, Wr-2(FF)-write_port 1, VSA=3;
end
for i=r-3, i>0, i--
    if (i is even)
        Ri(AA)-read_port 3, R1(55)-read_port 1, 2, 4 to 8, VSA=3;
        if (r is even)
            Wi(00)-write_port 2, Wr-1(FF)-write_port 1, VSA=3;
        else
            Wi(00)-write_port 2, Wr-2(FF)-write_port 1, VSA=3;
    else
        Ri(55)-read_port 3, R0(AA)-read_port 1, 2, 4 to 8, VSA=3;
        if (r is even)
            Wi(FF)-write_port 2, Wr-1(00)-write_port 1, VSA=3;
        else
            Wi(FF)-write_port 2, Wr-2(00)-write_port 1, VSA=3;
    end
end
if (r is even)
    W0(00)-write_port 2, Wr-1(FF)-write_port 1, VSA=3;
else
    W0(00)-write_port 2, Wr-2(FF)-write_port 1, VSA=3;
end STEP 5:
DIB0=FF-write_port 1, DIB1=00-write_port 2, VSA=4;
for i=1, i<r, i++
    if (i is even)
        DIBi=FF-write_port 1, DIBi=00-write_port 2, VSA=4;
        Rr-1(FF)-read_port 4, R0(00)-read_ports 1, 2, 3, 5 to 8, VSA=4;
    end
    DIBi=00-write_port 1, DIB0=FF-write_port 2, VSA=4;
    Rr-1(00)-read_port 4, R1(FF)-read_ports 1, 2, 3, 5 to 8, VSA=4;
end
if (r is even)
    Rr-1(FF)-read_port 4, R0(00)-read_ports 1, 2, 3, 5 to 8, VSA=4;
else
    Rr-1(00)-read_port 4, R1(FF)-read_ports 1, 2, 3, 5 to 8, VSA=4;
end STEP 6*:
for i=1, i<r, i+2
    Wi=00-write_port 2, W0=FF-write_port 1, Ri(00)-read_ports 1 to 8, VSA=4;
end
W0=00;

STEP 7**:
/*All location initialized to 00*/
Wr-1=FF;
for i=0, i<r, i++
    DIBi=FF-write_port 1, DIBr-1=00-write_port 2, VSA=5;
    Ri-1(00)-read_port 5, Rr-1(FF)-read_ports 1 to 4, 6 to 8, VSA=5;
end
Rr-1(FF)-read_port 5, R0(00)-read_ports 1 to 4, 6 to 8, VSA=5;
Wr-1=00, VSA=5;

FIG. 19C
TEST SEQUENCE FOR 8R2W

**STEP 8*:**
```
for i=1, i<r, i++
  Wi=FF-write_port 1, W0(00)-write_port 2, Ri(FF)-read_ports 1 to 8, VSR=5;
End
  W0(00)-write_port 1, R0(00)-read_ports 1 to 8, VSR=5;
```

STEP 9:**
```
for i=2, i<r, i++
  Ri-1(FF)-read_port 6, R0(00)-read_port 1 to 5, 7, 8, VSR=6;
  DIBi=00-write_port 1, DIB0=FF-write_port 2, VSR=6;
end
  Ar-1(FF)-read_port 6, R0(00)-read_port 1 to 5, 7, 8, VSR=6;
  DIB0=FF-write_port 1, W1(00)-write_port 2, VSR=6;
  R0(00)-read_port 6, R1(FF)-read_port 1 to 5, 7, 8, VSR=6;
```

STEP 10: /*All locations, except 0 has FF; location 0 has 00*/
```
for i=1, i<r-1, i++
  Ri(FF)-read_port 7, R0(00)-read_port 1 to 6, 8, VSR=7;
  Wi=00-write_port 1, Wr-1=FF-write_port 2, VSR=7;
End
  Ar-1(FF)-read_port 7, R0(00)-read_port 1 to 6, 8, VSR=7;
  Wr-1=00-write_port 1, W0=FF-write_port 2, VSR=7;
```

**STEP 11*:** /*All locations, except 0 initialized to 00;Location 0 initialized to FF*/
```
for i=1, i<r-1, i++
  Ri(00)-read_port 8, R0(FF)-read_ports 1 to 7, VSR=8;
  Wi(00)-write_port 2, Wr-1(00)-write_port 1, VSR=8;
End
  Ar-1(00)-read_port 8, R0(FF)-read_port 1 to 7, VSR=8;
  Wr-1=FF-write_port 2, W0=00-write_port 1, VSR=8;
```

——— BIT LINE LEAKAGE FAULT TEST ———

STEP 6(a): /*To be inserted between Steps 6, 7*/
```
for i=1, i<r, i++
  Wi(FF)-write_port 1, R0(00)-read_port 1 to 8, VSR=4;
  Ri(FF)-write_port 1, R0(00)-read_port 2 to 8, VSR=4;
  Wi(00)-write_port 1, VSR=4;
End
  W0(00)-write_port 1, R1(00)-read_port 2 to 8, VSR=4;
  R0(FF)-read_port 1, R1(00)-read_port 2 to 8, VSR=4;
  W0(00)-write_port 1, VSR=4;
```

STEP 8(a): /*To be inserted between Steps 8, 9*/
```
for i=1, i<r, i++
  Wi(00)-write_port 1, R0(FF)-read_port 1 to 8, VSR=5;
  Ri(00)-write_port 1, R0(FF)-read_port 2 to 8, VSR=5;
  Wi(FF)-write_port 1, VSR=5;
End
  W0(00)-write_port 1, R1(FF)-read_port 1 to 8, VSR=5;
  R0(00)-read_port 1, R1(FF)-read_port 2 to 8, VSR=5;
  W0(FF)-write_port 1, VSR=5;
```

FIG. 20A
MACRO TEST SEQUENCE FOR RFBR2W

STEP 1:
```
R0(AA)-write_port 1, W1(55)-write_port 2, R1(55)-read_ports 1 to 8;
for i=2, i<r, i++
    if (i is even)
        Wi(AA)-write_port 1, W1(55)-write_port 2, R1(55)-read_ports 1 to 8;
    else
        Wi(55)-write_port 1, W0(AA)-write_port 2, R0(AA)-read_ports 1 to 8;
    end
end
```

STRESSES WRITES AT LOCATION i BY
MAXIMIZING READ, WRITE COUPLING

STEP 2:
```
R0(AA)-read_port 1, R1(55)-read_ports (2 through 8);
W0(55)-write_port 2, W1(AA)-write_port 1, R1(AA)-read_ports 1 to 8;
for i=2, i<r, i++
    if (i is even)
        Ri(AA)-read_port 1, R0(55)-read_ports (2 through 8);
        Wi-1(AA)-write_port 2, W0(55)-write_port 1, R0(55)-read_ports 1 to 8;
    else
        Ri(55)-read_port 1, R1(AA)-read_ports (2 through 8);
        Wi-1(55)-write_port 2, W1(AA)-write_port 1, R1(AA)-read_ports 1 to 8;
    end
end
if (r is even)
    Wr-1(AA)-write_port 2, W0(55)-write_port 1, R0(55)-read_ports 1 to 8;
else
    Wr-1(55)-write_port 2, W1(AA)-write_port 1, R1(AA)-read_ports 1 to 8;
end
```

STRESSES READS BY
MAXIMIZING READ COUPLING

**STEP 3*:**
```
R0(55)-read_port 2, R1(AA)-read_ports 1, 3 to 8;
W0(AA)-write_port 1, W1(55)-write_port 2, R1(55)-read_ports 1 to 8;
for i=2, i<r, i++
    if (i is even)
        Ri(55)-read_port 2, R0(AA)-read_ports 1, 3 to 8;
        Wi-1(55)-write_port 1, W0(AA)-write_port 2, R0(AA)-read_ports 1 to 8;
    else
        Ri(AA)-read_port 2, R1(55)-read_ports 1, 3 to 8;
        Wi-1(AA)-write_port 1, W1(55)-write_port 2, R1(55)-read_ports 1 to 8;
    end
end
if (r is even)
    Wr-1(55)-write_port 1, W0(AA)-write_port 2, R0(AA)-read_ports 1 to 8;
else
    Wr-1(AA)-write_port 1, W1(55)-write_port 2, R1(55)-read_ports 1 to 8;
end
```

FIG. 20B
MACRO TEST SEQUENCE FOR RF8R2W

```
STEP 4:
if (r is even)
   Rr-1(55)-read_port 3, R0(AA)-read_port 1, 2, 4 to 8;
   Rr-2(AA)-read_port 3, R1(55)-read_port 1,2,4 to 8;
   Wr-1(FF)-write_port 2, Wr-2(00)-write_port 1;
else
   Rr-1(AA)-read_port 3, R1(55)-read_port 1, 2, 4 to 8;
   Rr-2(55)-read_port 3, R0(AA)-read_port 1, 2, 4 to 8;
   Wr-1(00)-write_port 2, Wr-2(FF)-write_port 1;
end
for i=r-3, i>0, i--
   if (i is even)
      Ri(AA)-read_port 3, R0(AA)-read_port 1, 2, 4 to 8;
      if (r is even)
         Wi(00)-write_port 2, Wr-1(FF)-write_port 1;
      else
         Wi(FF)-write_port 2, Wr-2(FF)-write_port 1;
   else
      Ri(55)-read_port 3, R0(AA)-read_port 1, 2, 4 to 8;
      if (r is even)
         Wi(FF)-write_port 2, Wr-2(00)-write_port 1;
      else
         Wi(00)-write_port 2, Wr-1(00)-write_port 1;
end
end
if (r is even)
   W0(00)-write_port 2, Wr-1(FF)-write_port 1;
else
   W0(00)-write_port 2, Wr-2(FF)-write_port 1;
```

```
STEP 5:
DIB0=FF-write_port 1, DIB1=00-write_port 2;
for i=1, i<r, i++
   if (i is even)
      DIBi=FF-write_port 1, DIB1=00-write_port 2;
      Rr-1(FF)-read_port 4, R0(00)-read_ports 1, 2, 3, 5 to 8;
   end
   DIB0=00-write_port 1, DIB0=FF-write_port 2;
   Rr-1(00)-read_port 4, R1(FF)-read_ports 1, 2, 3, 5 to 8;
end
if (r is even)
   Rr-1(FF)-read_port 4, R0(00)-read_ports 1, 2, 3, 5 to 8;
else
   Rr-1(00)-read_port 4, R1(FF)-read_ports 1, 2, 3, 5 to 8;
end
```

```
STEP 6*:
for i=1, i<r, i+2
   Wi=00-write_port 2, W0=FF-write_port 1, Ri(00)-read_ports 1 to 8;
End
W0=00;
```

```
STEP 7**:
/*All location initialized to 00*/
Wr-1=FF;
for i=0, i<r, i++
   DIBi=FF-write_port 1, DIBr-1=00-write_port 2;
   Ri-1(00)-write_port 5, Rr-1(FF)-read_ports 1 to 4, 6 to 8;
end
Rr-1(FF)-read_port 5, R0(00)-read_ports 1 to 4, 6 to 8;
Wr-1=00;
```

FIG. 20C
MACRO TEST SEQUENCE FOR RF8R2W

```
STEP 8*:/* BIT LINE LEAKAGE AND INITIALIZATION MERGED*/(??)
for i=1, i<r, i++
    Wi=FF-write_port 1, W0(00)-write_port 2, Ri(FF)-read_ports 1 to 8;
End
    W0(00)-write_port 1, R0(00)-read_ports 1 to 8;

STEP 9**:
for i=2, i<r, i++
    Ri-1(FF)-read_port 6, R0(00)-read_port 1 to 5, 7, 8;
    DIBi=00-write_port 1, DIB0=FF-write_port 2;
end
    Ar-1(FF)-read_port 6, R0(00)-read_port 1 to 5, 7, 8;
    DIB0=FF-write_port 1, W1(00)-write_port 2;
    R0(00)-read_port 6, R1(FF)-read_port 1 to 5, 7, 8;

STEP 10:
/*All locations, except 0 has FF; location 0 has 00*/
for i=1, i<r-1, i++
    Ri(FF)-read_port 7, R0(00)-read_port 1 to 6, 8;
    Wi=00-write_port 1, Wr-1=FF-write_port 2;
End
    Ar-1(FF)-read_port 7, R0(00)-read_port 1 to 6, 8;
    Wr-1=00-write_port 1, W0=FF-write_port 2;

STEP 11*:
/*All locations, except 0 initialized to 00, Location 0 initialized to FF*/
for i=1, i<r-1, i++
    Ri(00)-read_port 8, R0(FF)-read_ports 1 to 7;
    Wi(FF)-write_port 2, Wr-1(00)-write_port 1;
End
    Ar-1(00)-read_port 8, R0(00)-read_port 1 to 7;
    Wr-1=FF-write_port 2, W0=00-write_port 2;
```

— BIT LINE LEAKAGE FAULT TEST —

```
STEP 6(a):/*To be inserted between Steps 6, 7*/
for i=1, i<r, i++
    Wi(FF)-write_port 1, R0(00)-read_port 1 to 8;
    Ri(FF)-read_port 1, R0(00)-read_port 2 to 8;
    Wi(00)-write_port 1;
End
    W0(FF)-write_port 1, R1(00)-read_port 1 to 8;
    R0(FF)-read_port 1, R1(00)-read_port 2 to 8;
    W0(00)-write_port 1;

STEP 8(a):/*To be inserted between Steps 8, 9*/
for i=1, i<r, i++
    Wi(00)-write_port 1, R0(FF)-read_port 1 to 8;
    Ri(00)-read_port 1, R0(FF)-read_port 2 to 8;
    Wi(FF)-write_port 1;
End
    W0(00)-write_port 1, R1(FF)-read_port 1 to 8;
    R0(00)-read_port 1, R1(FF)-read_port 2 to 8;
    W0(FF)-write_port 1;
```

FIG. 21A
MACRO TEST SEQUENCE FOR RF10R4W

```
STEP 1:
W0(AA)-write_port 1, W1(55)-write_port 2, W3(55)-write_port 3, W5(55)-write_port 4, R1(55)-read_ports 1 to 10;
W1(55)-write_port 2, W0(AA)-write_port 1, W2(AA)-write_port 3, W4(AA)-write_port 4, R0(AA)-read_ports 1 to 10;
W2(AA)-write_port 3, W1(55)-write_port 2, W3(55)-write_port 1, W5(55)-write_port 4, R1(55)-read_ports 1 to 10;
W3(55)-write_port 2, W0(AA)-write_port 1, W2(AA)-write_port 3, W4(AA)-write_port 4, R0(AA)-read_ports 1 to 10;
W4(AA)-write_port 2, W1(55)-write_port 1, W3(55)-write_port 3, W5(55)-write_port 4, R1(55)-read_ports 1 to 10;
W5(55)-write_port 2, W0(AA)-write_port 1, W2(AA)-write_port 3, W4(AA)-write_port 4, R0(AA)-read_ports 1 to 10;
for i=6, i<r-1, i++
   if (i is even)
      Wi(AA)-write_port 1, W1(55)-write_port 2, W3(55)-write_port 3, W5(55)-write_port 4, R1(55)-read_ports 1 to 10;
   else
      Wi(55)-write_port 1, W0(AA)-write_port 2, W2(AA)-write_port 3, W4(AA)-write_port 4, R0(AA)-read_ports 1 to 10;
   end
end
```

```
STEP 2:
R0(AA)-read_port 1, R1(55)-read_ports 2 to 10;
W0(55)-write_port 2, W1(AA)-write_port 1, W3(AA)-write_port 3, W5(AA)-write_port 4, R1(AA)-read_ports 1 to 10;
W1(AA)-write_port 2, W0(55)-write_port 1, W2(55)-write_port 3, W4(55)-write_port 4, R0(55)-read_ports 1 to 10;
W2(55)-write_port 2, W1(AA)-write_port 1, W3(AA)-write_port 3, W5(AA)-write_port 4, R1(AA)-read_ports 1 to 10;
W3(AA)-write_port 2, W0(55)-write_port 1, W2(55)-write_port 3, W4(55)-write_port 4, R0(55)-read_ports 1 to 10;
W4(55)-write_port 2, W1(AA)-write_port 1, W3(AA)-write_port 3, W5(AA)-write_port 4, R1(AA)-read_ports 1 to 10;
W5(AA)-write_port 2, W0(55)-write_port 1, W2(55)-write_port 3, W4(55)-write_port 4, R0(55)-read_ports 1 to 10;
for i=6, i<r-1, i++
   if (i is even)
      Ri(AA)-read_port 1, R0(55)-read_ports 2 to 10;
      Wi(AA)-write_port 2, W0(55)-write_port 1, W2(55)-write_port 3, W4(55)-write_port 4, R0(55)-read_ports 1 to 10;
   else
      Ri(55)-read_port 1, R1(AA)-read_ports 2 to 8;
      Wi(55)-write_port 2, W1(AA)-write_port 1, W2(AA)-write_port 3, W5(AA)-write_port 4, R1(AA)-read_ports 1 to 10;
   end
end
if (r is even)
   Wr-1(AA)-write_port 2, W0(55)-write_port 1, W2(55)-write_port 3, W4(55)-write_port 4, R0(55)-read_ports 1 to 10;
else
   Wr-1(55)-write_port 2, W1(AA)-write_port 1, W3(AA)-write_port 3, W5(AA)-write_port 4, R1(AA)-read_ports 1 to 10;
end
```

FIG. 21B
MACRO TEST SEQUENCE FOR RF10R4W

```
STEP 3:
R0(55)-read_port 2, R1(AA)-read_ports 1, 3 to 10;
W0(AA)-write_port 3, W1(55)-write_port 2, W3(55)-write_port 4, R1(55)-read_ports 1 to 10;
W1(55)-write_port 3, W0(AA)-write_port 2, W2(AA)-write_port 4, R0(AA)-read_ports 1 to 10;
W2(AA)-write_port 3, W1(55)-write_port 2, W3(55)-write_port 4, R1(55)-read_ports 1 to 10;
W3(55)-write_port 3, W2(AA)-write_port 2, W4(AA)-write_port 4, R0(AA)-read_ports 1 to 10;
W4(AA)-write_port 3, W3(55)-write_port 2, W5(55)-write_port 4, R1(55)-read_ports 1 to 10;
W5(55)-write_port 3, W4(AA)-write_port 2, R0(AA)-read_ports 1 to 10;
for i=6, i<r-1, i++
    if (i is even)
        Ri(55)-read_port 2, R0(AA)-read_ports 1, 3 to 10;
        Wi-1(55)-write_port 3, W0(AA)-write_port 1, W2(AA)-write_port 2, Wi(AA)-write_port 4, R0(AA)-read_ports 1 to 10;
    else
        Ri(AA)-read_port 1, R1(55)-read_ports 2 to 8;
        Wi-1(AA)-write_port 3, W1(55)-write_port 1, W3(55)-write_port 2, Wi(55)-write_port 4, R1(55)-read_ports 1 to 10;
    end
end
if (r is even)
    Wr-1(55)-write_port 3, W0(AA)-write_port 1, W2(AA)-write_port 2, W3(55)-write_port 4, R0(AA)-read_ports 1 to 10;
else
    Wr-1(AA)-write_port 3, W1(55)-write_port 1, W3(55)-write_port 2, W5(55)-write_port 4, R1(55)-read_ports 1 to 10;
end
```

FIG. 21C
MACRO TEST SEQUENCE FOR RF10R4W

```
STEP 4:
if (r is even)
        Rr-1(55)-read_port 3, R0(AA)-read_port 1, 2, 4 to 10;
        Rr-2(AA)-read_port 3, R1(55)-read_port 1, 2, 4 to 10;
        Wr-1(FF)-write_port 4, Wr-2(00)-write_port 1;Wr-4(00)-write_port 2, Wr-6(00)-write_port 3;
        Wr-3(FF)-write_port 1, Wr-5(FF)-write_port 2;
else
        Rr-1(AA)-read_port 3, R1(55)-read_port 1, 2, 4 to 10;
        Rr-2(55)-read_port 3, R0(AA)-read_port 1, 2, 4 to 10;
        Wr-1(00)-write_port 4, Wr-2(FF)-write_port 1;Wr-4(FF)-write_port 2, Wr-6(FF)-write_port 3;
        Wr-3(00)-write_port 1, Wr-5(00)-write_port 2;
end
for i=r-3, i>0, i--
   if (i is even)
        Ri(AA)-read_port 3, R1(55)-read_port 1, 2, 4 to 10;
        if (r is even)
           Wi(00)-write_port 4, Wr-1(FF)-write_port 1;Wr-3(FF)-write_port 2, Wr-5(FF)-write_port 3;
        else
           Wi(00)-write_port 4, Wr-2(FF)-write_port 1;Wr-4(FF)-write_port 2, Wr-6(FF)-write_port 3;
   else
        Ri(55)-read_port 3, R0(AA)-read_port 1, 2, 4 to 10;
        if (r is even)
           Wi(FF)-write_port 4, Wr-2(00)-write_port 1, Wr-4(00)-write_port 2, Wr-6(00)-write_port 3;
        else
           Wi(FF)-write_port 4, Wr-1(00)-write_port 1, Wr-3(00)-write_port 2, Wr-5(00)-write_port 3;
   end
end
if (r is even)
        W0(00)-write_port 4, Wr-1(FF)-write_port 1, Wr-3(FF)-write_port 2, Wr-5(FF)-write_port 3;
else
        W0(00)-write_port 4, Wr-2(FF)-write_port 1, Wr-4(FF)-write_port 2, Wr-6(FF)-write_port 3;
```

FIG. 21D
MACRO TEST SEQUENCE FOR RF10R4W

```
STEP 5:
DIB0=FF-write_port 1, DIB1=00-write_port 2;DIB3=00-write_port 3, DIB5=00-write_port 4;
for i=1, i<r, i++
    if (i is even)
        DIBi=FF-write_port 1, DIB1=00-write_port 2;DIB3=00-write_port 3, DIB5=00-write_port 4;
        Ri-1(FF)-read_port 4, R0(00)-read_ports 1, 2, 3, 5 to 10;
    else
        DIBi=00-write_port 1, DIB0=FF-write_port 2;DIB2=FF-write_port 3, DIB4=FF-write_port 4;
        Ri-1(00)-read_port 4, R1(FF)-read_ports 1, 2, 3, 5 to 10;
    end
end
if (r is even)
    Rr-1(FF)-read_port 4, R0(00)-read_ports 1, 2, 3, 5 to 10;
else
    Rr-1(00)-read_port 4, R1(FF)-read_ports 1, 2, 3, 5 to 10;
end
```

```
STEP 6*:
for i=1, i<r, i+2
    Wi=00-write_port 2, Ri(00)-read_ports 1 to 10;
End
W0=00;
```

```
STEP 7**:
/*All location initialized to 00*/
Wr-1=FF-write_port 3, Wr-2=FF-write_port 2, Wr-3=FF-write_port 1;
for i=0, i<r-3, i++
    DIBi=FF-write_port 3, DIBr-1=00-write_port 1, DIBr-2=00-write_port 2, DIBr-3=00-write_port 4;
    Ri-1(00)-read_port 5, Rr-1(FF)-read_ports 1 to 4, 6 to 10;
end
Rr-1(FF)-read_port 5, R0(00)-read_ports 1 to 4, 6 to 10;
Wr-1=00;
```

FIG. 21E
MACRO TEST SEQUENCE FOR RF1OR4W

**STEP 8*:**
```
for i=1, i<r, i++
  Wi=FF-write_port 4, W0(00)-write_port 2, Ri(FF)-read_ports 1 to 10;
End
W0=(00)-write_port 4, R0(00)-read_ports 1 to 10;
```

STEP 9:**
```
for i=2, i<r, i++
  Ri-1(FF)-read_port 6, R0(00)-read_port 1 to 5, 7 to 10;
  DIB1=00-write_port 1, DIB0=FF-write_port 2;
end
  Ar-1(FF)-read_port 6, R0(00)-read_port 1 to 5, 7 to 10;
  DIB0=FF-write_port 1, W1(00)-write_port 2;
  R0(00)-read_port 6, R1(FF)-read_port 1 to 5, 7 to 10;
```

STEP 10:
```
/*All locations, except 0 has FF; location 0 has 00*/
for i=1, i<r-1, i++
  Ri(FF)-read_port 7, R0(00)-read_port 1 to 6, 8 to 10;
  Wi=00-write_port 1, Wr-1=FF-write_port 2;
End
  Ar-1(FF)-read_port 7, R0(00)-read_port 1 to 6, 8 to 10;
  Wr-1=00-write_port 1, W0=FF-write_port 2;
```

**STEP 11*:**
```
/*All locations, except 0 initialized to 00; location 0 initialized to FF*/
for i=1, i<r-1, i++
  Ri(00)-read_port 8, R0(FF)-read_ports 1 to 7, 9, 10;
  Wi(FF)-write_port 1;
End
  Ar-1(00)-read_port 8, R0(FF)-read_ports 1 to 7, 9, 10;
  Wr-1=FF-write_port 2, W0=00-write_port 2;
```

**STEP 12*:** /*Additional steps to exercise read_ports 9, 10*/
```
/*All locations initialized to FF; except location 0*/
for i=1, i<r-1, i++
  Ri(FF)-read_port 9, R0(00)-read_ports 1 to 10;
  Ri(FF)-read_port 10, R0(00)-read_ports 1 to 10;
End
  R0(00)-read_port 9, R1(FF)-read_port 1 to 9;
  R0(00)-read_port 10, R1(FF)-read_port 1 to 9;
```

---
BIT LINE LEAKAGE FAULT TEST
---

STEP 6(a): /*To be inserted between Steps 6, 7*/
```
for i=1, i<r, i++
  Wi(FF)-write_port 1, R0(00)-read_port 1 to 10;
  Ri(FF)-read_port 1, R0(00)-read_port 2 to 10;
  Wi(00)-write_port 1;
End
  W0(FF)-write_port 1, R1(00)-read_port 1 to 10;
  R0(FF)-read_port 1, R1(00)-read_port 2 to 10;
  W0(00)-write_port 1;
```

STEP 8(a): /*To be inserted between Steps 8, 9*/
```
for i=1, i<r, i++
  Wi(00)-write_port 1, R0(FF)-read_port 1 to 10;
  Ri(00)-read_port 1, R0(FF)-read_port 2 to 10;
  Wi(FF)-write_port 1;
End
  W0(00)-write_port 1, R1(FF)-read_port 1 to 10;
  R0(00)-read_port 1, R1(FF)-read_port 2 to 10;
  W0(FF)-write_port 1;
```

FIG. 22A
MACRO TEST SEQUENCE FOR RF6R4W

```
STEP 1:
W0(AA)-write_port 1, W1(55)-write_port 2, W3(55)-write_port 3, W5(55)-write_port 4, R1(55)-read_ports 1 to 6;
W1(55)-write_port 2, W0(AA)-write_port 1, W2(AA)-write_port 3, W4(AA)-write_port 4, R0(AA)-read_ports 1 to 6;
W2(AA)-write_port 3, W1(55)-write_port 2, W3(55)-write_port 1, W5(55)-write_port 4, R1(55)-read_ports 1 to 6;
W3(55)-write_port 2, W0(AA)-write_port 1, W2(AA)-write_port 3, W4(AA)-write_port 4, R0(AA)-read_ports 1 to 6;
W4(AA)-write_port 2, W1(55)-write_port 1, W3(55)-write_port 3, W5(55)-write_port 4, R1(55)-read_ports 1 to 6;
W5(55)-write_port 2, W0(AA)-write_port 1, W2(AA)-write_port 3, W4(AA)-write_port 4, R0(AA)-read_ports 1 to 6;
for i=6, i<r-1, i++
   if (i is even)
      Wi(AA)-write_port 1, W1(55)-write_port 2, W3(55)-write_port 3, W5(55)-write_port 4, R1(55)-read_ports 1 to 6;
   else
      Wi(55)-write_port 1, W0(AA)-write_port 2, W2(AA)-write_port 3, W4(AA)-write_port 4, R0(AA)-read_ports 1 to 6;
   end
end
```

```
STEP 2:
R0(AA)-read_port 1, R1(55)-read_ports 2 to 6;
W0(55)-write_port 2, W1(AA)-write_port 1, W3(AA)-write_port 3, W5(AA)-write_port 4, R1(AA)-read_ports 1 to 6;
W1(AA)-write_port 2, W0(55)-write_port 1, W2(55)-write_port 3, W4(55)-write_port 4, R0(55)-read_ports 1 to 6;
W2(55)-write_port 2, W1(AA)-write_port 1, W3(AA)-write_port 3, W5(AA)-write_port 4, R1(AA)-read_ports 1 to 6;
W3(AA)-write_port 2, W0(55)-write_port 1, W2(55)-write_port 3, W4(55)-write_port 4, R0(55)-read_ports 1 to 6;
W4(55)-write_port 2, W1(AA)-write_port 1, W3(AA)-write_port 3, W5(AA)-write_port 4, R1(AA)-read_ports 1 to 6;
W5(AA)-write_port 2, W0(55)-write_port 1, W2(55)-write_port 3, W4(55)-write_port 4, R0(55)-read_ports 1 to 6;
for i=6, i<r-1, i++
   if (i is even)
      Ri(AA)-read_port 1, R0(55)-read_ports 2 to 6;
      Wi(AA)-write_port 1, W0(55)-write_port 2, W2(55)-write_port 3, W4(55)-write_port 4, R0(55)-read_ports 1 to 6;
   else
      Ri(55)-read_port 1, R1(AA)-read_ports 2 to 8;
      Wi(55)-write_port 2, W1(AA)-write_port 1, W2(AA)-write_port 3, W5(AA)-write_port 4, R1(AA)-read_ports 1 to 6;
   end
end
if (r is even)
   Wr-1(AA)-write_port 2, W0(55)-write_port 1, W2(55)-write_port 3, W4(55)-write_port 4, R0(55)-read_ports 1 to 6;
else
   Wr-1(55)-write_port 2, W1(AA)-write_port 1, W3(AA)-write_port 3, W5(AA)-write_port 4, R1(AA)-read_ports 1 to 6;
end
```

FIG. 22B
MACRO TEST SEQUENCE FOR RF6R4W

```
STEP 3:
R0(55)-read_port 2, R1(AA)-read_ports 1, 3 to 6;
W0(AA)-write_port 3, W1(55)-write_port 1, W3(55)-write_port 2, W5(55)-write_port 4, R1(55)-read_ports 1 to 6;
W1(55)-write_port 3, W0(AA)-write_port 1, W2(AA)-write_port 2, W4(AA)-write_port 4, R0(AA)-read_ports 1 to 6;
W2(AA)-write_port 3, W1(55)-write_port 1, W3(55)-write_port 2, W5(55)-write_port 4, R1(55)-read_ports 1 to 6;
W3(55)-write_port 3, W0(AA)-write_port 1, W2(AA)-write_port 2, W4(AA)-write_port 4, R0(AA)-read_ports 1 to 6;
W4(AA)-write_port 3, W1(55)-write_port 1, W3(55)-write_port 2, W5(55)-write_port 4, R1(55)-read_ports 1 to 6;
W5(55)-write_port 3, W0(AA)-write_port 1, W2(AA)-write_port 2, W4(AA)-write_port 4, R0(AA)-read_ports 1 to 6;
for i=6, i<r-1, i++
  if (i is even)
    Ri(55)-read_port 2, R0(AA)-read_ports 1, 3 to 6;
    Wi-1(55)-write_port 3, W0(AA)-write_port 1, W2(AA)-write_port 2, W4(AA)-write_port 4, R0(AA)-read_ports 1 to 6;
  else
    Ri(AA)-read_port 1, R1(55)-read_ports 2 to 8;
    Wi-1(AA)-write_port 3, W1(55)-write_port 1, W3(55)-write_port 2, W5(55)-write_port 4, R1(55)-read_ports 1 to 6;
  end
end
if (r is even)
  Wr-1(55)-write_port 3, W0(AA)-write_port 1, W2(AA)-write_port 2, W4(AA)-write_port 4, R0(AA)-read_ports 1 to 6;
else
  Wr-1(AA)-write_port 3, W1(55)-write_port 1, W3(55)-write_port 2, W5(55)-write_port 4, R1(55)-read_ports 1 to 6;
end
```

FIG. 22C
MACRO TEST SEQUENCE FOR RF6R4W

```
STEP 4:
if (r is even)
        Rr-1(55)-read_port 3, R0(AA)-read_port 1, 2, 4 to 6;
        Rr-2(AA)-read_port 3, R1(55)-read_port 1, 2, 4 to 6;
        Wr-1(FF)-write_port 4, Wr-2(00)-write_port 1;Wr-4(00)-write_port 2, Wr-6(00)-write_port 3;
        Wr-3(FF)-write_port 1, Wr-5(FF)-write_port 2;
else
        Rr-1(AA)-read_port 3, R1(55)-read_port 1, 2, 4 to 6;
        Rr-2(55)-read_port 3, R0(AA)-read_port 1, 2, 4 to 6;
        Wr-1(00)-write_port 4, Wr-2(FF)-write_port 1;Wr-4(FF)-write_port 2, Wr-6(FF)-write_port 3;
        Wr-3(00)-write_port 1, Wr-5(00)-write_port 2;
end
for i=r-3, i>0, i--
    if (i is even)
        Ri(AA)-read_port 3, R1(55)-read_port 1, 2, 4 to 6;
        if (r is even)
            Wi(00)-write_port 4, Wr-1(FF)-write_port 1;Wr-3(FF)-write_port 2, Wr-5(FF)-write_port 3;
        else
            Wi(00)-write_port 4, Wr-2(FF)-write_port 1;Wr-4(FF)-write_port 2, Wr-6(FF)-write_port 3;
    else
        Ri(55)-read_port 3, R0(AA)-read_port 1, 2, 4 to 6;
        if (r is even)
            Wi(FF)-write_port 4, Wr-2(00)-write_port 1, Wr-4(00)-write_port 2, Wr-6(00)-write_port 3;
        else
            Wi(FF)-write_port 4, Wr-1(00)-write_port 1, Wr-3(00)-write_port 2, Wr-5(00)-write_port 3;
    end
end
if (r is even)
        W0(00)-write_port 4, Wr-1(FF)-write_port 1, Wr-3(FF)-write_port 2, Wr-5(FF)-write_port 3;
else
        W0(00)-write_port 4, Wr-2(FF)-write_port 1, Wr-4(FF)-write_port 2, Wr-6(FF)-write_port 3;
```

FIG. 22D
MACRO TEST SEQUENCE FOR RF6R4W

```
STEP 5:
DIB0=FF-write_port 1, DIB1=00-write_port 2; DIB3=00-write_port 3, DIB5=00-write_port 4;
for i=1, i<r, i++
   if (i is even)
      DIBi=FF-write_port 1, DIB1=00-write_port 2; DIB3=00-write_port 3, DIB5=00-write_port 4;
      Ri-1(FF)-read_port 4, R0(00)-read_ports 1, 2, 3, 5 to 6;
   else
      DIBi=00-write_port 1, DIB0=FF-write_port 2; DIB2=FF-write_port 3, DIB4=FF-write_port 4;
      Ri-1(00)-read_port 4, R1(FF)-read_ports 1, 2, 3, 5 to 6;
   end
end
if (r is even)
   Rr-1(FF)-read_port 4, R0(00)-read_ports 1, 2, 3, 5 to 6;
else
   Rr-1(00)-read_port 4, R1(FF)-read_ports 1, 2, 3, 5 to 6;
end
```

```
STEP 6*:
for i=1, i<r, i+2
   Wi=00-write_port 2, Ri(00)-read_ports 1 to 6;
End
W0=00;
```

```
STEP 7**:
/*All location initialized to 00*/
Wr-1=FF-write_port 3, Wr-2=FF-write_port 2, Wr-3=FF-write_port 1;
for i=0, i<r-3, i++
   DIBi=FF-write_port 3, DIBr-1=00-write_port 1, DIBr-2=00-write_port 2, DIBr-3=00-write_port 4;
   Ri-1(00)-read_port 5, Rr-1(FF)-read_ports 1 to 4, 6 to 6;
end
Rr-1(FF)-read_port 5, R0(00)-read_ports 1 to 4, 6 to 6;
Wr-1=00;
```

FIG. 22E
MACRO TEST SEQUENCE FOR RF6R4W

**STEP 8*:**
for i=1, i<r, i++
  Wi=FF-write_port 4, W0(00)-write_port 2, Ri(FF)-read_ports 1 to 6;
End
  W0=00-write_port 4, R0(00)-read_ports 1 to 6;

STEP 9:**
for i=2, i<r, i++
  Ri-1(FF)-read_port 6, R0(00)-read_port 1 to 5;
  DIBi=00-write_port 1, DIB0=FF-write_port 2;
end
  Ar-1(FF)-read_port 6, R0(00)-read_port 1 to 5;
  DIB0=FF-write_port 1, W1(00)-write_port 2;
  R0(00)-read_port 6, R1(FF)-read_port 1 to 5;

STEP 10:
/*All locations, except 0 has FF; location 0 has 00*/
for i=1, i<r-1, i++
  Ri(FF)-read_port 1, R0(00)-read_port 2 to 6;
  Wi=00-write_port 1, Wr-1=FF-write_port 2;
End
  Ar-1(FF)-read_port 1, R0(00)-read_port 2 to 6;
  Wr-1=00-write_port 1, W0=FF-write_port 2;

**STEP 11*:**
/*All locations, except 0 initialized to 00; Location 0 initialized to FF*/
for i=1, i<r-1, i++
  Ri(00)-read_port 1, R0(FF)-read_ports 2 to 6;
  Wi(FF)-write_port 2, Wr-1(00)-write_port 1;
End
  Ar-1(00)-read_port 1, R0(FF)-read_port 2 to 6;
  Wr-1=FF-write_port 2, W0=00-write_port 2;

──── BIT LINE LEAKAGE FAULT TEST ────

STEP 6(a): /*To be inserted between Steps 6, 7*/
for i=1, i<r, i++
  Wi(FF)-write_port 1, R0(00)-read_port 1 to 6;
  Ri(FF)-read_port 1, R0(00)-read_port 2 to 6;
  Wi(00)-write_port 1;
End
  W0(FF)-write_port 1, R1(FF)-read_port 1 to 6;
  R0(FF)-read_port 1, R1(00)-read_port 2 to 6;
  W0(00)-write_port 1;

STEP 8(a): /*To be inserted between Steps 8, 9*/
for i=1, i<r, i++
  Wi(00)-write_port 1, R0(FF)-read_port 1 to 6;
  Ri(00)-read_port 1, R0(FF)-read_port 2 to 6;
  Wi(FF)-write_port 1;
End
  W0(00)-write_port 1, R1(00)-read_port 1 to 6;
  R0(00)-read_port 1, R1(FF)-read_port 2 to 6;
  W0(FF)-write_port 1;

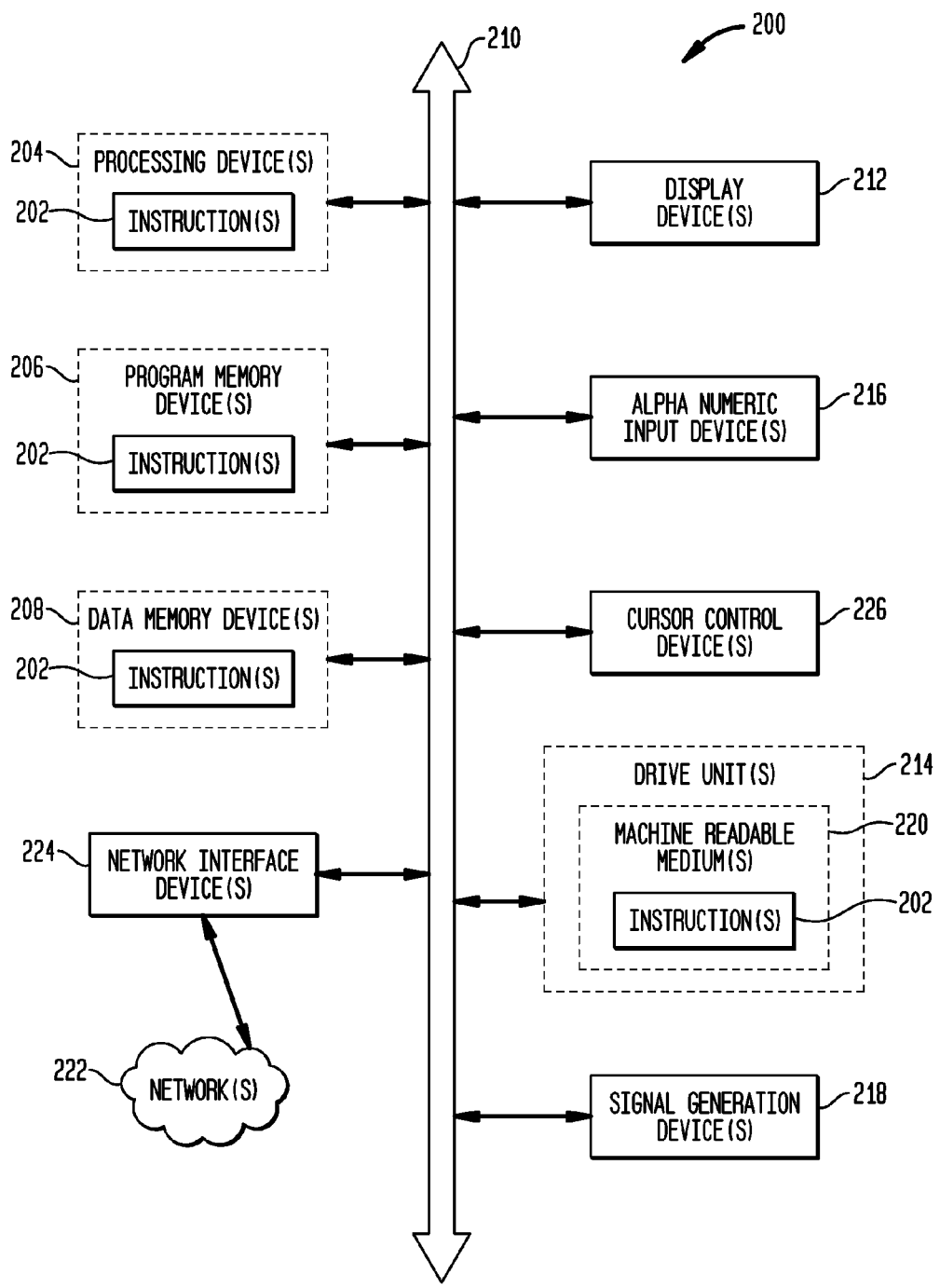

VICTIM PORT-BASED DESIGN FOR TEST AREA OVERHEAD REDUCTION IN MULTIPORT LATCH-BASED MEMORIES

BACKGROUND

1. Field

The present invention relates generally to the electrical, electronic, and computer arts, and more particularly relates to electronic circuit testing.

2. Related Art

Embedded memory has greater speed and bus-width capability. Embedded memories are rapidly growing as a dominant segment of system-on-chip (SoC) designs. Latch-based arrays are often used in embedded memories to store data. Compared to scannable flip-flop arrays, latch-based arrays occupy far less silicon area. In a typical design, there are a large number of such small embedded memories. Thus, it is important to ascertain the integrity of latch-based arrays.

SUMMARY

Various embodiments of the invention relate to a device, method, and computer-readable medium that reduce an amount of silicon or chip real estate dedicated for use during testing in a multiport latch-based device. To accomplish this, illustrative embodiments utilize a multiplexer and a register that selectively direct signals within the device during a test mode. In this manner, embodiments of the invention enable a resulting device to exhibit a reduced footprint and power consumption.

In accordance with an embodiment of the invention, a multiport latch-based memory device is provided, which includes a latch array, a plurality of first multiplexers, and a second multiplexer. The latch array is responsive to output data from an input data register in a functional mode associated with the latch-based memory device. The plurality of first multiplexers is responsive to output data from the latch array in the functional mode. The plurality of first multiplexers is responsive to output data from the input data register in a test mode associated with the latch-based memory device. The second multiplexer selectively provides output data from the plurality of first multiplexers to the input data register in the test mode, thereby providing a data path bypassing the latch array in the test mode.

The multiport latch-based memory device also includes a selection register, and the second multiplexer selectively provides output data from the plurality of first multiplexers to the input data register based on output data from the selection register in the test mode. The multiport latch-based memory device includes input shadow logic, and the input data register is responsive to output data from the input shadow logic in the functional mode. The multiport latch-based memory device includes output shadow logic responsive to output data from the plurality of first multiplexers in the functional mode. The multiport latch-based memory device is configured to perform a read victim port operation in the test mode, which includes reading a data pattern from a first read port simultaneously with reading a bit-wise complement of the data pattern from a second read port. The first read port and the second read port are associated with the latch array, and the first read port is a read victim port. The multiport latch-based memory device is configured to perform a write victim port operation in the test mode, which includes writing a data pattern to a first write port simultaneously with writing a bit-wise complement of the data pattern to a second write port, and reading the bit-wise complement of the data pattern from a second read port.

The following detailed description of embodiments of the invention is to be read in connection with the accompanying drawings.

BRIEF DESCRIPTION OF THE DRAWINGS

The following drawings are provided by way of example only and without limitation, wherein like reference numerals (when used) indicate corresponding elements throughout the several views, and wherein:

FIG. 6 shows a built-in self test algorithm;

FIGS. 7a-b show augmented latch-based array scan tests that have 11 steps;

FIG. 8 shows a derivation of test pairs applied to neighboring cells 66 and 65 in steps of a boundary transition delay fault (TDF) scan test;

FIG. 17a is a test sequence illustrating a read victim port concept;

FIG. 17b is a test sequence illustrating a write victim port concept;

FIGS. 19a-c is a test sequence for an 8 read port, 2 write port register file array for use with the embodiment of the invention shown in FIG. 18;

FIGS. 20a-c is a test sequence for an 8 read port, 2 write port register file array for use with the embodiment of the invention shown in FIG. 18;

FIGS. 21a-e is a test sequence for a 10 read port, 4 write port register file array for use with the embodiment of the invention shown in FIG. 18;

FIGS. 22a-e is a test sequence for a 6 read port, 4 write port register file array for use with the embodiment of the invention shown in FIG. 18; and FIG. 23 is a block diagram of an embodiment of a machine in the form of a computing system configured to perform the methods of the invention.

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

Embodiments herein will be described in the context of illustrative devices and methods, as well as computer-readable medium configured to reduce silicon or chip real estate in multiport latch-based memory devices, which is dedicated for use during testing of such devices. It should be understood, however, that the embodiments are not limited to these or any other particular circuit arrangements. Rather, the embodiments are more generally applicable to techniques for reducing the size and power consumption of multiport latch-based memory devices, among other features. Moreover, it will become apparent to those skilled in the art given the teachings herein that numerous modifications can be made to the embodiments described while remaining within the scope of the disclosure. That is, no limitations with respect to the specific embodiments described herein are intended or should be inferred.

Functional fault models have been defined to mimic errors in memory. Tests for these fault models have also been developed. However, latch cells in the latch-based array are conventionally considered as black boxes, and thus only boundary nodes of the latch cells are targeted. Static and dynamic fault behaviors in memory cells of DRAM have been investigated. Dynamic fault models are those in which faults manifest themselves in two or more sequences of operations. The testing of dynamic faults in SRAMs and DRAMs has also been investigated. However, latch cells referred to herein are very different from standard DRAM and SRAM cells.

Memory built-in-self-test (BIST) is widely used to test memory. However, additional circuitry, such as a self-test controller for on-chip test generation is required for BIST. Different RAM BIST architectures for testing large memories have been investigated. However, the silicon size of BIST logic is large when compared with the small memory systems, such as latch-based arrays in SoC designs.

Figure 1:
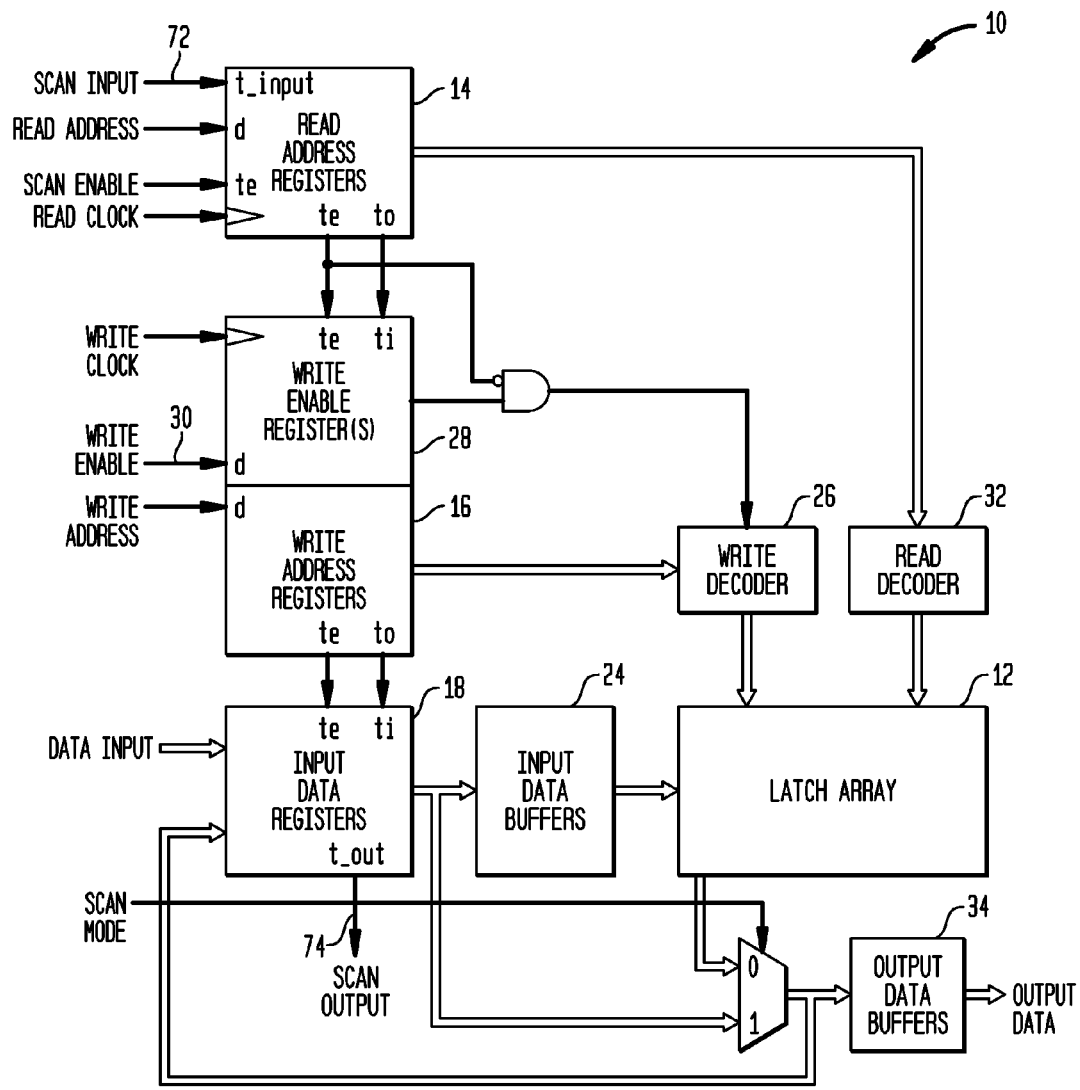
FIG. 1 is a block diagram of an embedded memory system.
Figure 2:
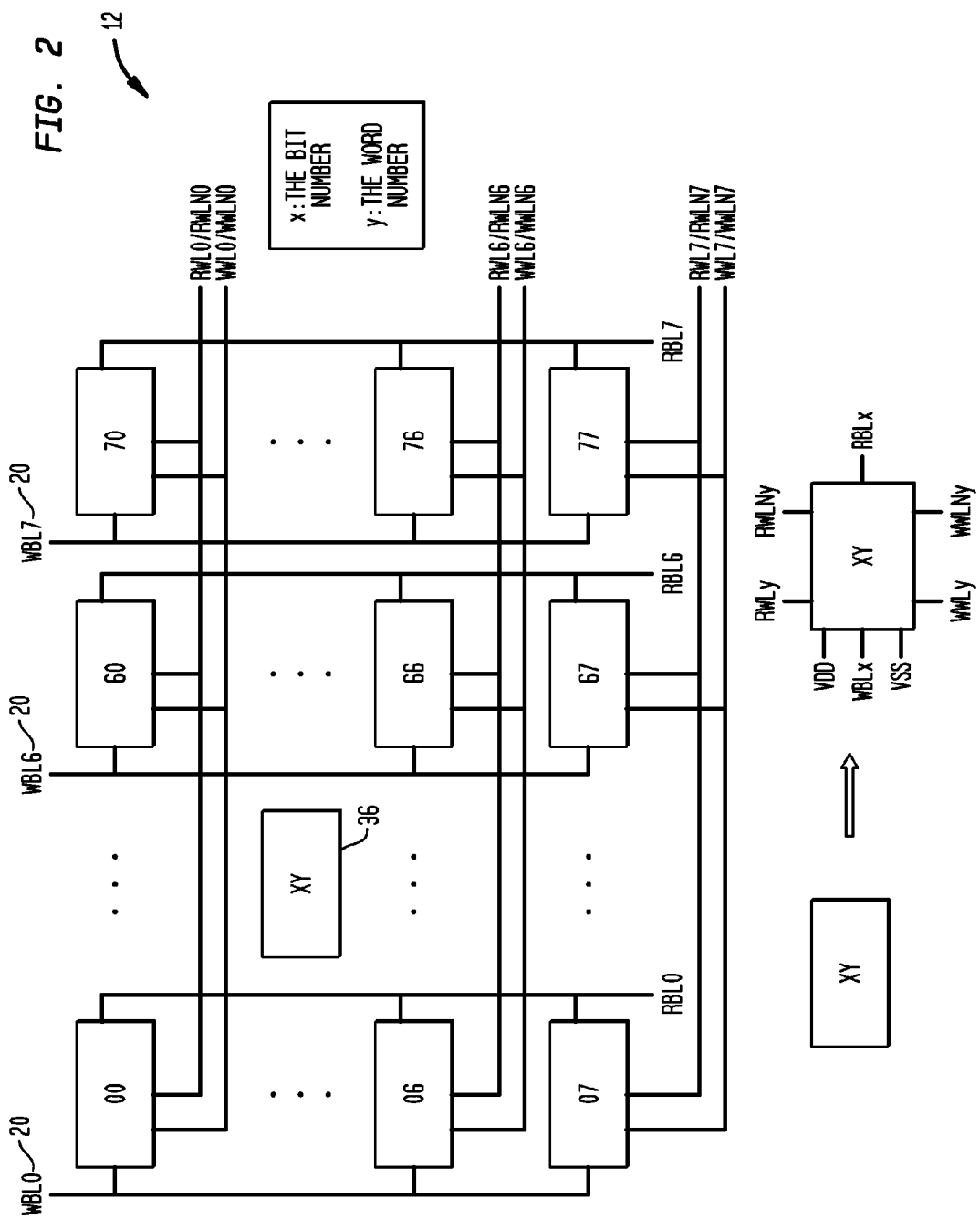
FIG. 2 is a block diagram of a latch-based array used in the embedded memory system shown in FIG. 1.

FIG. 1 is a block diagram of a small embedded memory system 10 and FIG. 2 is a block diagram of a latch-based array 12 used in the embedded memory system 10. Read address registers (RARs) 14, write address registers (WARs) 16, and input data registers (IDRs) 18 provide read addresses, write addresses, and input data to the latch-based array 12, respectively.

The latch-based array 12 varies by size. An 8×8 latch-based array 12 is shown in FIG. 2. Observations and conclusions based on the 8×8 latch-based array 12 are applicable to other array sizes. The latch-based array 12 obtains data inputs (WBL0-7) 20 from IDRs 18 through input data buffers (IDBs) 24. Write decoders 26 extract the word address to be written (WWL) from WARs 16 and write enable registers (WERs) 28. When write enable 30 is active, the word input data from the IDBs 24 are stored in the array 12. Similarly, a read decoder 32 extracts the word (RWL) to be read from the RARs 14. In a normal or functional mode of operation, the output data of the latch-based array 12 enters into functional logic through output data buffers (ODBs) 34. RWLN and WWLN are the inverse of RWL and WWL in FIG. 2, respectively.

Figure 3:
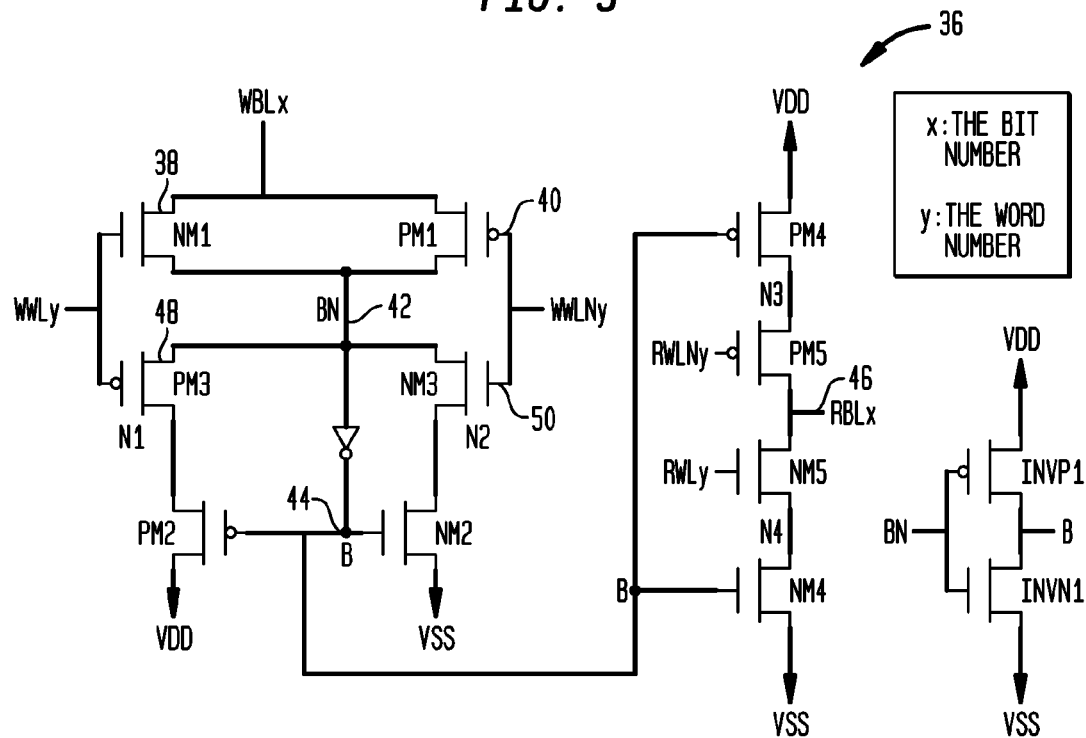
FIG. 3 is a transistor-level schematic of a single cell in the latch-based array shown in FIG. 2.

Faults residing in a single cell and bridging faults between cells of the array 12 shown in FIG. 2 will now be discussed. FIG. 3 shows a transistor-level schematic of a single cell xy 36 in the latch-based array 12. Herein, x represents a bit number and y represents a word number in the latch-based array 12 of FIG. 2. When write enable is active and the cell in the word is selected to be written (WWLy=1), the data is written into the cell at WBLx. WWLy=1 sets WWLN to 0, which turns both transistors NM1 38 and PM1 40 on. Hence, the value of node WBLx propagates to an internal node BN 42 in FIG. 3. The logic value of node B 44 is set to the inverse of the value at node BN 42. This value is stored in the latch cell until the next write access of that latch. When the word is chosen to be read out (that is, RWL=1 and RWLN=0) the value stored in cell xy 36 propagates to output RBLx 46. When the write address changes, WWLy goes low. This turns transistors PM3 48 and NM3 50 on, and turns transistors NM1 38 and PM1 40 off. Thus, changes at WBLx cannot propagate into the cell xy.

Bit cells in the latch-based array 12 can be written at the same time as their contents are being read. If the content of a latch changes as a result of the write operation, the output corresponding to that latch also changes. This occurs when write enable is 1 while the address being read is written to, which is referred to herein as a write-through operation. In the write-through operation, new data, not the old data, is being read out from the bit cell.

Figure 4:
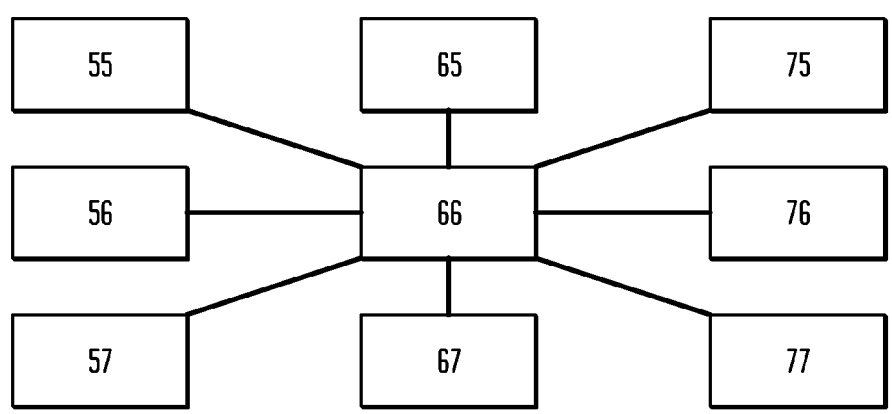
FIG. 4 is a block diagram of neighboring cells in the latch-based array shown in FIG. 2.

FIG. 3 shows that the cells used in the latch-based array are very different from standard high-density SRAM bit cells. Thus, functional fault models used for high-density SRAM or embedded DRAMs are not used for latch-based arrays. Stuck-at faults (SAFs) and stuck-open (SOP) faults internal to the cell, and bridging faults between pairs of cell internal signals (intra-BFs) are considered in latch-based array fault models. For an SAF, the faulty node directly connects power (VDD) for stuck-at-1 fault or to ground (VSS) for a stuck-at-0 fault. For stuck-open faults, drain, source, and gate opens for each transistor inside a cell are considered. A finite resistance is inserted between the faulty node and the node to which it would otherwise be connected. In intra-BFs, a negligible resistance is inserted between two bridged nodes. In addition, bridging faults between adjacent cells (inter-BFs) are also tested. In FIG. 4, if cell 66 is the target cell, bridging faults between pairs of target cell signal and signal in cells 55, 56, 57, 65, 67, 75, 76, and 77 are considered. In the example cell 36 of FIG. 2, there are a total of 12 transistors and 12 nodes. Thus, a comprehensive fault set includes 24 SAFs, 36 SOPs, 66 intra-BFs and 1152 inter-BFs.

Figure 5:
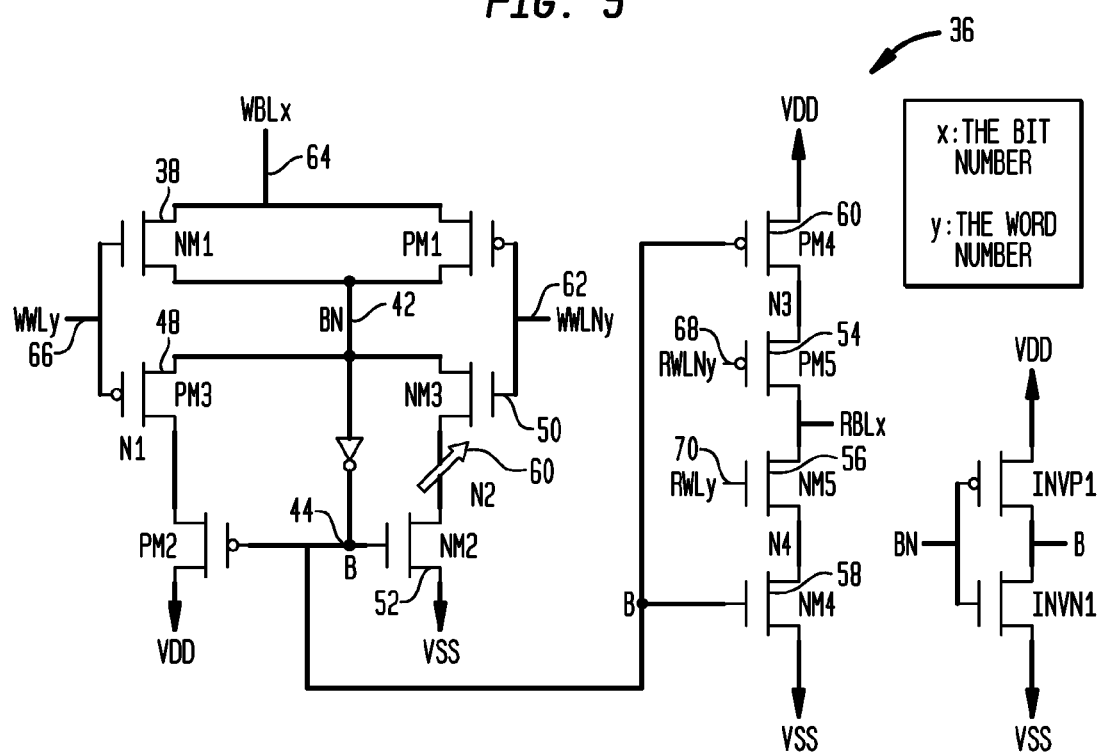
FIG. 5 is a transistor-level schematic of a single cell in the latch-based array shown in FIG. 2.

To detect an internal fault, WBLx, WWLy, and RWLy are set to appropriate values by loading IDRs 18, WERs 28, WARs 16, and RARs 14. For example, a detection condition for a stuck-at-1 fault at node N2 52 highlighted by arrow 60 in FIG. 5 is to turn on both transistors NM2 54 and NM3 56 by setting both nodes B 44 and WWLNy 62 to 1. Applying WBLx=0 and WWLy=1 during the write operation, node BN 42 is set to 0 and thus node B 44 is 1. When this faulty cell is read, RWLy 70 and RWLNy 68 are set to 1 and 0, respectively, which turns PM5 54 and NM5 56 on. In addition, WWLy 66 changes to 0 (WWLNy=1) which turns transistors NM3 50 and PM3 48 on. In a fault-free circuit, nodes BN 42 and B 44 retain logic values 0 and 1, respectively. Thus, NM4 58 is on and the output RBLx=0 is read out. However, in a faulty circuit, nodes BN 42 and B 44 are changed to 1 and 0, respectively, due to node N2 52 being stuck-at 1. Transistor PM4 60 is turned on and a 1 is read out, rather than a 0. Thus, in order to detect this fault, 0 is written into cell 36 followed by reading cell 36. When reading the cell, it should not be written simultaneously while other array locations are written.

As indicated above, the overhead for BIST logic is large when compared to the size of small embedded memories. Scan tests for the detection of faults internal to latch-based arrays will now be discussed.

To contain area overhead, only the registers at the periphery of the memory are scanned. In the embedded memory shown in FIG. 1, scan logic is built into IDR 18, WER 28, WAR 16, and RAR 14. The latch-based array 12 is tested using scan patterns shifted into RAR 14, WER 28, WAR 16, IDR 18, and IDB 24. Scan patterns are shifted in at scan input, which is the t_ input 72 of RAR 14 in FIG. 1. When loading these registers, the latch-based array 12 is bypassed by disabling the write enable. As a result, contents of the memory array are not changed during the shifting mode. In the latch-based array test mode, the loaded scan pattern is applied to the latch-based array 12. The outputs of the array 12 are fed back into the IDR 18 and shifted out at t_ out 74. Each memory operation, read, write and write-through, is performed at normal operational speed using a skew load (launch-of-shift) transition test. This testing does not scan the latch-based array 12, and incorporation of scan logic into the latch-based array 12 will increase the area overhead of the DFT logic.

Consider the fault N2 stuck-at-1 and assume that this fault occurs in cell 66 (i.e. x=6, y=6) shown in FIG. 4. To detect this fault, 0 is written into address location 6 using the scan test IDR=0000, WAR=110, WER=1, and RAR=XXX, where X represents a do not care bit. This is followed by reading data out using scan test IDR=XXXX, WAR=111, WER=0 and RAR=110. The read data is captured in IDR 18, and the response is shifted out and compared. Thus, two at-speed scan patterns are used to detect this stuck-at fault. The first pattern writes in the data at operational speed and the second pattern reads back the data just written at operational speed. There are two types of transition tests: a broad-side and a skewed load transition test. These two test differ in the way a transition at the target location is launched.

In order to target a comprehensive set of faults in the cell array 12, a set of tests is used to target transition delay faults (TDFs) at the cell boundary. The scan tests for boundary TDFs mimic the memory BIST tests shown in FIG. 6. Step 1 initializes the latch-based array with data pattern AAH or 10101010B for even address locations and data pattern 55H or 01010101B for odd address locations. If an 8×8 array is used, this step applies 8 scan patterns that write data into the memory at normal operating speed.

In step 2, the test reads values stored in step 1 and writes the data pattern 55H to even address locations and data pattern AH's to odd address locations. Each word is read and compared with the expected value before updating that word with new data. For example, the first scan pattern of this step reads address location 0 (RAR=000) and compares it to AAH. The second pattern will read location 1 (RAR=001) and compare it to 55H and simultaneously write 55H into location 0 (WAR=001). Therefore, for an 8×8 latch-based array, a total of 9 scan patterns are applied.

Step 3 reads the values stored in step 2. In addition, data pattern FFH is written to odd address locations and data pattern 00H is written into even address locations. In this step, unlike other steps, the read and write operations are carried out in decrementing address order. Again, step has 9 scan patterns for an 8×8 latch-based array.

Step 4 writes data patterns 00H and FFH to even and odd address locations with all bits write disabled (WER=0). The values stored in the array will not change in a defect-free circuit. This step also reads and compares values written into the array from the previous step. A total of 9 patterns are applied in this step for an 8×8 array.

Step 5 writes data pattern FFH to even address locations and data pattern 00H to odd address locations. The words are read out while they are written to. For example, the first scan pattern writes data pattern FFH into word 0 and simultaneously this new data is read out and compared to FFH. This is used to ascertain the integrity of at-speed write and read operations to the same address. In this step, 8 patterns are applied for an 8×8 latch-based array.

For the steps described above, except for step 3, memory is accessed in incrementing address order. For step 3, memory is accessed in decrementing address order. A total of 43 scan patterns are used for testing an 8×8 latch-based array or 5*r+3 patterns are applied for an r×r latch-based array, where r is an integer.

In step 2, the scan pattern is shifted into RAR, WER, WAR and IDR sets IDR=XXXX, WAR=XXX, WER=0 and RAR=000. The content of word 0, RBL=A in a fault free circuit, is read out and compared. The second sequence is then shifted into the registers and sets IDR=0101, WAR=000, WER=1 and RAR=001. Data pattern 55H is written into word 0 and word 1 is simultaneously read out. The value captured in IDR is then compared with the expected value of 55H or 01010101B.

The set of scan tests, described above, detects TDFs at boundary nodes of the latch-based array. For example, word 0 is set to data pattern 10101010B (AAH) after step 1, and data pattern 01010101B (55H) is written in step 2. This generates the 0-to-1 transition at boundary node WBL0. The output is read and compared in step 3. Since all write and read operations are at-speed, a slow-to-rise fault at WBL0 is tested. This set of tests also detects boundary stuck-at faults (SAFs).

To determine the fault coverage of internal faults by boundary TDI scan tests an 8×8 latch-based array is simulated. The target cell is cell 66. An SOP fault is modeled by inserting a 100 mega-ohm resistor at the fault site. A 10 micro-ohm resistor is inserted between the bridged nodes for bridging faults. The SAFs, intra-BFs, and SOP faults are injected one at a time into cell 66. The inter-BFs are injected between cell 66 and adjacent cells as shown in FIG. 4. The decoded tests drive the WBLs, WWLs, and RWLs of the latch-based array. The duration between tests is set large enough to model loading of the scan chain.

TABLE 1

|  | SAFs | SOPs | Intra-BFs | Inter-BFs |
| --- | --- | --- | --- | --- |
| Detect Coverage | 23/24 (95.8%) | 15/36 (41.7%) | 51166 (77.3%) | 97511152 (84.6%) |

The SAFs, SOPs, BFs inside a cell, and inter-BFs coverage is summarized in the second row of Table 1, which shows simulation results of latch-based array boundary transition delay fault (TDF) scan tests. These tests exhibit good coverage of SAFs and bridging faults. Latch cell internal TDFs at nodes B and BN are also detected by the boundary TDF scan tests. However, columns 2-5 show that about 4.2% SAL 58.3% SOP faults, 22.7% intra-bridging faults, and 15.4% inter-bridging faults are not detected. Therefore, boundary TDF scan test miss some internal faults of the latch-based array, specifically SOP faults. However the boundary TDF scan tests are augmented to address these gaps.

Figure 7A:
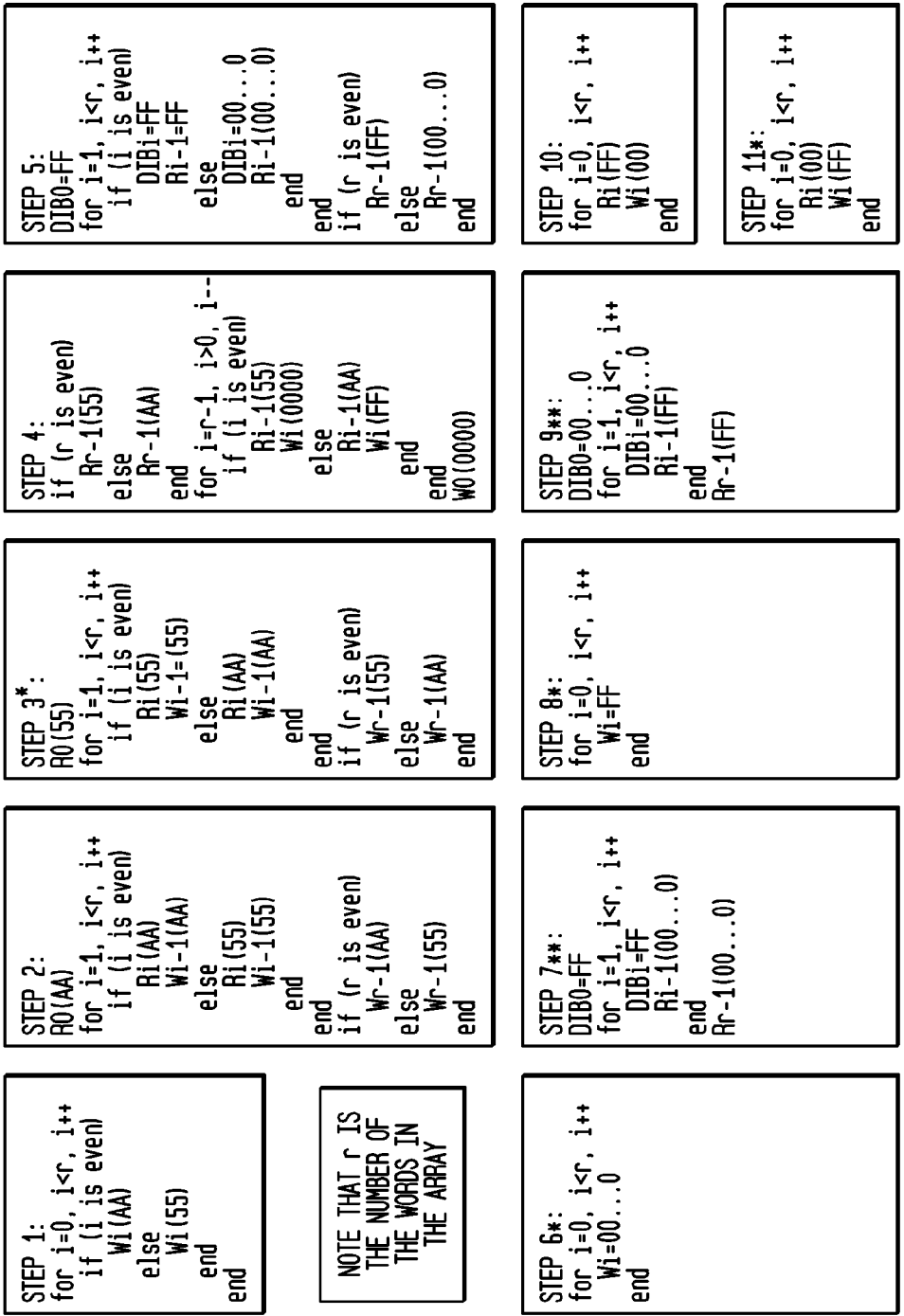

FIGS. 7a-b show augmented latch-based array scan tests which have 11 steps. The added steps are steps 3, 6, 7, 8, 9, and 11. Except in step 4, address locations in each step are written and read in incrementing address order.

The first two steps are the same as step 1 and 2 of the boundary TDF scan tests above and shown in FIG. 6, in which 17 patterns are used for a latch-based array of size 8×8. Step 1 initializes the latch-based array with data pattern AAH for even address locations and data pattern 55H for odd address locations. Step 2 checks the stored contents from the previous step and writes data pattern 55H to even address locations and data pattern AAH to odd address locations.

In step 3, data pattern AAH is written to even address locations and data pattern 55H to odd address locations from word 0 to word 7 in an 8×8 latch-based array. The values are also read to ascertain the integrity of the write operations in step 2. Step 4 writes data pattern FFH into odd address locations and data pattern 00H to even address locations in decrementing address order. This step is the same as step 3 of the boundary TDF scan tests. In step 5, data patterns FFH and 00H to even and odd address locations with bit masking enabled. The values stored in the latch-based array are not changed in this step. The memory locations are also read and compared in these steps. A total of 27 scan patterns are applied in these patterns for an 8×8 latch-based array.

Steps 6 to 9 are additional tests that serve as data retention tests. Step 6 reinitializes the latch-based array by writing data pattern 00H into all address locations. If an address location is written while all word write bits are disabled, the write operation is referred to herein as a "pseudo write operation". Step 7 pseudo writes data pattern FFH into the latch-based array. This step can repeat multiple times if a longer retention time is needed. These two steps are used to check the retention of logic 00H in each cell of the latch-based array. Similarly, step 8 reinitializes the array to FFH and step 9 pseudo writes data pattern 00H to ascertain the integrity of retaining logic 1 for all address locations. These steps add another 34 scan patterns for an 8×8 latch-based array.

Steps 10 and 11 are write-through operations. Steps 10 and 11 write data patterns 00H and FFH to the latch-based array, respectively. The contents are read simultaneously. These steps not only check the fast write and read operations but also detect additional internal faults. A total of 94 scan patterns are used for an 8×8 latch-based array in this augmented latch-based array scan tests set. For an r×r array, 11*r+6 patterns are applied.

Detection of bridging faults requires that two bridged nodes are set to different logic values. The four test pairs, 1-1, 0-0, 1-0, and 0-1, at two adjacent cells, detect all inter-bridging faults between those cells. Some inter-bridging faults are not detected by boundary TDF scan tests since it does not apply all four combinations to some pairs of neighboring cells.

A test pair a-b is defined as being applied to neighboring cells X-Y if X=a, Y=b when either X or Y is being read back. For example, in the test that reads cell 66 and writes cell 65, if cell 65 stores 1 and cell 66 stores 0, test pair 0-1 has been applied to adjacent cells 66-65. In the test that reads 65 and writes cell 64, 1-0 is applied to cells 66-65 if cell 66 and cell 65 store 1 and 0, respectively.

FIG. 8 shows a derivation of test pairs applied to neighboring cells 66 and 65 in each step of the boundary TDF scan tests.

In step 1, since there is no read operation, no test pair is applied. This step initializes cell 66 to 0 and cell 65 to 1. In step 2, address locations are read and written in incrementing address order. When word 5 is read and word 4 is written, cells 66 and 65 have values 0 and 1, respectively. Test pair 0-1 is applied to cells 66-65. Next, word 6 is read and 0's are written into word 5 simultaneously. Since cell 66 still retains a value of 0, test pair 0-0 is applied. Thus, test pairs 0-0 and 0-1 are applied to cells 66-65 in step 2.

Step 3 writes and reads address locations in decrementing address order. As a result, word 6 is read before word 5. After step 2, cell 66 and cell 65 store values 1 and 0, respectively. Thus, in step 3, when word 6 is read and word 7 is written, test pair 1-0 is applied. Then, word 5 is read and 0 is written to cell 66. Thus, test pair 0-0 is applied since cell 65 changes to 0. In this step, test pairs 1-0 and 0-1 are applied.

In step 4, no word is written. This step reads the contents of address locations written in previous steps. Test pair 0-1 is applied in both tests in which word 5 and word 6 are read.

Step 5 is a write-through operation. The address locations being written into are read out simultaneously. Data that is read back is the newly written data. After step 4, the contents of cells 66 and 65 are 0 and 1, respectively. Test pair 0-0 is applied in the test that writes 0 into cell 65 and reads this address location since the content of cell 65 changes to 0. Next, a logic 1 is written into cell 66 and read back. Test pair 1-0 is applied since cell 66 stores 1 and cell 65 stores 0. Thus, two test pairs, 0-0 and 1-0, are applied in this step.

Figure 9:
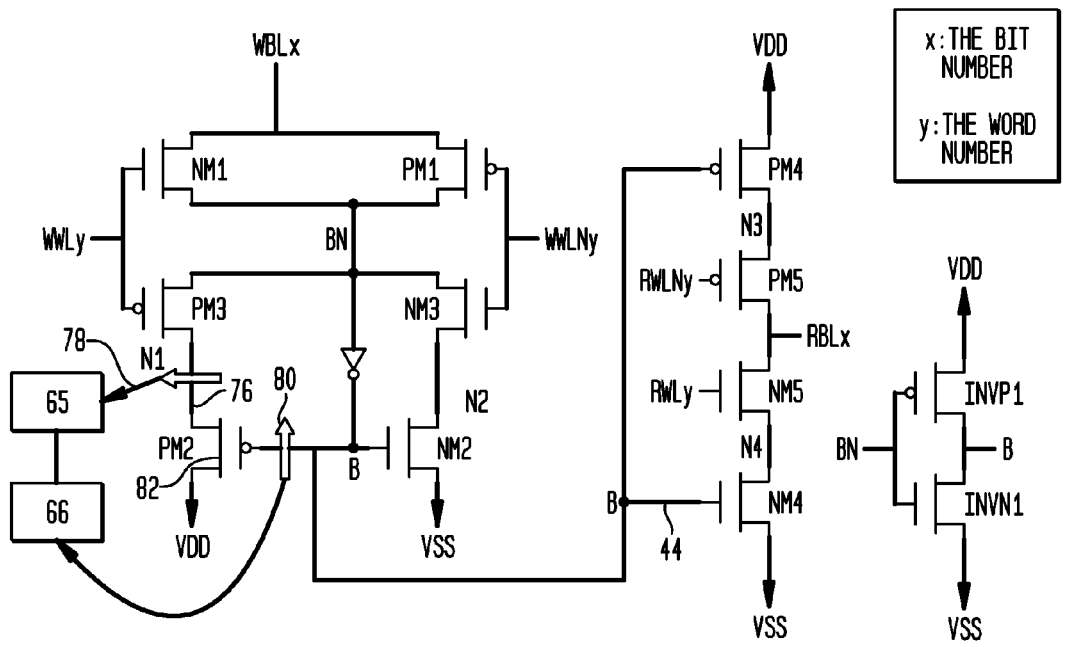
FIG. 9 is a transistor-level schematic of two cells in the latch-based array shown in FIG. 2 showing one or more faults.

Cell that are adjacent to the target cell 66 are shown in FIG. 4. Test pairs to be applied between cell 66 and its adjacent cells are derived in accordance with the test pairs described above for cell pair 66-65, as shown in Table 2 below. The boundary TDF scan tests in Table 2 do not include test pairs 1-1 and 0-0 for cells 66-65 and cells 66-67, respectively. The missing test pairs are used to detect additional inter-BFs. Consider the inter-BFs between node B 44 in cell 66 and node N1 76 in cell 65. FIG. 9 highlights the fault sites by arrows 78, 80, and nodes N1 76 and B 44 are from cells 65 and 66, respectively. In order to detect this bridging fault, either N1=1, B=0 or N1=0, B=1. However, N1 cannot be set to 0. Thus, N1=1 and B=0 is the only option. A logic 1 is written into cell 65 to have N1=1, and PM2 82 is turned on by B=0. Thus, cells 65 and 66 should store a logic 1, which indicates test pair 1-1 is required. A similar analysis shows that the missing test pair 0-0 applied at cell pair 66-67 is also needed for detection of other faults.

TABLE 2

| Cells | Step 2 | Step 3 | Step 4 | Step 5 |
|---|---|---|---|---|
| 66-55 | 0-0, 0-1 | 1-1, 0-1 | 0-1 | 0-0, 1-0 |
| 66-65 | 0-1, 0-0 | 1-0, 0-0 | 0-1 | 0-0, 1-0 |
| 66-75 | 0-0, 0-1 | 1-1, 0-1 | 0-1 | 0-0, 1-0 |
| 66-56 | 0-1 | 1-0 | 0-0 | 1-1 |
| 66-76 | 0-1 | 1-0 | 0-0 | 1-1 |
| 66-57 | 0-0, 1-0 | 1-1, 1-1 | 0-1 | 1-1, 1-0 |
| 66-67 | 0-1, 1-1 | 1-0, 1-1 | 0-1 | 1-1, 1-0 |
| 66-77 | 0-0, 1-0 | 1-1, 1-1 | 0-1 | 1-1, 1-0 |

To cover this gap, step 3 is added in the augmented latch-based array scan tests between steps 2 and 4 of the original boundary TDF scan tests. Step 3 applies the new test pair 1-1 to cell pair 66-65 and also applies test pair 0-0 to cells 66-67. Thus, all test pairs for inter-bridging faults are covered.

Many latch cell internal SOP faults in the logic used to store the cell value are not detected by the boundary TDF scan tests since the logic retains the value from a previous write operation. By giving enough time and increasing leakage of this logic, internal nodes will charge or discharge to faulty values. This feature can be used by initializing the cell to 0 (1) followed by pseudo writing 1 (0) into the cell. This pseudo write can be repeated many times depending on the cell retention time. In addition, these tests can be applied at a higher temperature to decrease the retention time. Pseudo writing the inverse value of the cell content and high temperature testing help to detect larger range resistances of SOP faults and decrease the wait time.

Figure 10:
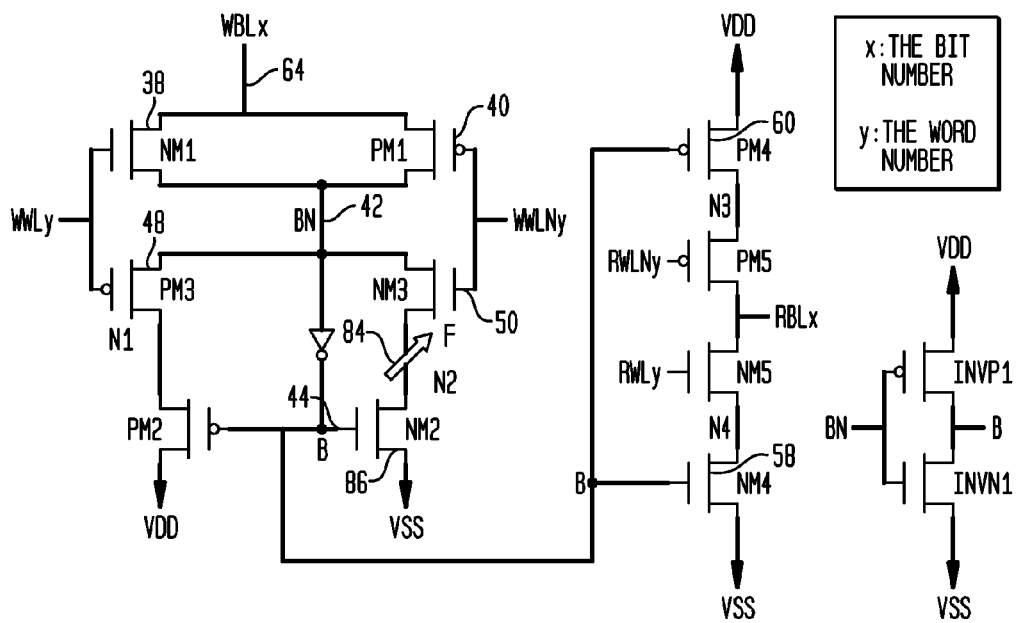
FIG. 10 is a transistor-level schematic of a single cell in the latch-based array shown in FIG. 2 showing one or more faults.

For example, consider an SOP fault located on the drain (N2) of transistor NM3 shown in FIG. 10. The fault site is highlighted by an arrow 84 and F denotes the faulty node. In the fault-free circuit, F is connected to N2. When logic 0 is written to this cell, WWLy is 1, RWLy is 0, and WBLx=0. NM1 38 and PM1 40 are on, and NM3 50 and PM3 48 are off since WWLNy~0 and WWLy=1. Thus, logic 0 at WBLx propagates to node BN 42 and sets node B 44 to 1. The output is not read since RWLy=0 and RWLN=1 turn NM5 56 and PM5 54 off, respectively. During the read operation, WWLy=0 and RWLy=1. Change on WBLx has no impact on the content stored in the cell in the fault-free circuit since WWLy=0 and WWLNy=1 turn transistors NMI 38 and PM1 40 off. NM4 58 and NM5 56 are on due to B=1 and RWLy=1. The content of cell, RBLx=0 written previously, is read out and compared.

In the faulty circuit, the drain of NM3 50 is open. Thus, node BN 42 is floating but still retains the fault-free value 0 from the previous write operation. However, if 1 is pseudo written into the faulty cell (WBLx=1 with WWLy=0) a subthreshold leakage current between drain and source of PM1 40 is exhibited. This leakage current is exhibited during pseudo writing with the inverse data of the cell content. Thus, node BN 42 will charge to faulty value 1. Node B i44 s then set to 0 turning PM4 60 on. In the following read operation, faulty value 1 is read. As a result, this SOP fault is detected by test writing 0 into the cell followed by pseudo writing 1 for that cell. The value is read out and compared in the following step. The open fault discussed above can affect the functional mode of operation when the address location that has the defective cell is read a long period after it is written.

Based on the above discussion, step 6 is added to write data pattern 00H into cells to initialize the latch-based array. Step 7 pseudo writes data pattern FFH to change the values stored in step 6. When a fault is exhibited, faulty values are read out and compared. If a single step is not able to discharge the value from fault-free to faulty, this step can be repeated. The number of repetitions needed is data retention time dependent and also depends on the time to load the scan chains. In step 6, data patterns 00H are written into the array.

Node WBLx 64 in FIG. 10 retains 0 during this step. Nodes BN 42 and WBLx 64 have the same value 0. Therefore, no leakage is exhibited between nodes BN 42 and WBLx 64. The rate of charging node BN 42 to faulty value 1 is negligible. Starting at step 7, after one scan loading process, data patterns FFH are pseudo written to word 0. Node WBLx 64 is set to 1. This is followed by another scan loading process that pseudo writes 1 to word 1 and reads word 0 out for comparing simultaneously. During the second scan loading, node WBLx 64 retains 1, and thus node BN 42 of word 0 charges to 1. Therefore, assuming S is the time to load the scan chain, the retention time provided for word 0 is S when step 7 is applied for the first time. Similarly, data retention time is calculated for word L to be (L+1)*S if step 7 is applied only once.

If step 7 is applied twice, the word OH is read after first two scan loadings of the second application of step 7. Retention time provided by the first application of step 7 is r*S for an r×r array. Therefore, the retention time of word 0 is (r+2)*S. The provided retention time of word L is ((r+1) (L+1))*S. If step 7 is applied n times, the retention time provided for word L is ((r+1)*(n−1)+(L+1))*S. In order to detect the SOPs in FIG. 10 in all cells of the array, the time to charge node BN 42 to a faulty value, which is referred to as t_ char, is made less than the data retention time of word 0 since the retention time provided for the remainder of the word is longer. Given t_ char, r, and 5, n can be defined such that t_ char<((r+1)*(n−1)+1)*S.

Steps 8 and 9 are added for reasons similar to that of steps 6 and 7. Step 8 writes data pattern FFH and step 9 pseudo writes data pattern 00H to the latch-based array. The values stored in the cells in step 8 are discharged to faulty value 0 if faults are exhibited, following which these values are read and compared in step 9. Step 9 are repeated to improve detection.

In the fault discussed above, before node BN 42 charges to faulty value 1 and node B 44 goes low, there is a discharge current flowing from node BN 42 to VSS through NM3 50 and NM2 86. This current flows across the faulty site, and the greater the open resistance is, the lower the current is. Therefore, in order to detect such an open fault with lower resistance or as wider resistance range, the leakage current is increased and the charging current is decreased across the open fault. Raising the test temperature can also accomplish this result. Raising the test temperature will exponentially increase the subthreshold leakage current, increase the open resistance, and thus decrease the charging current across the faulty site. Accordingly, applying the test steps described above at higher temperature is recommended to widen the detectable resistance range of SOP faults.

Alternatively, given the SOP fault discussed above with a fixed resistance, raising the test temperature increases the discharge/charge rate and changes the stored value in the cell to a faulty value faster. This reduces the number of pseudo writes and decreases testing time.

Step 5 of boundary TDF scan tests is applied to check the write-through operation. Additional internal SOP faults are detected by a fast back-to-back write and read operation with appropriate initial conditions. Two write-through steps, steps 10 and 11 in the augmented latch-based array scan tests, are added to detect these additional faults.

Figure 11:
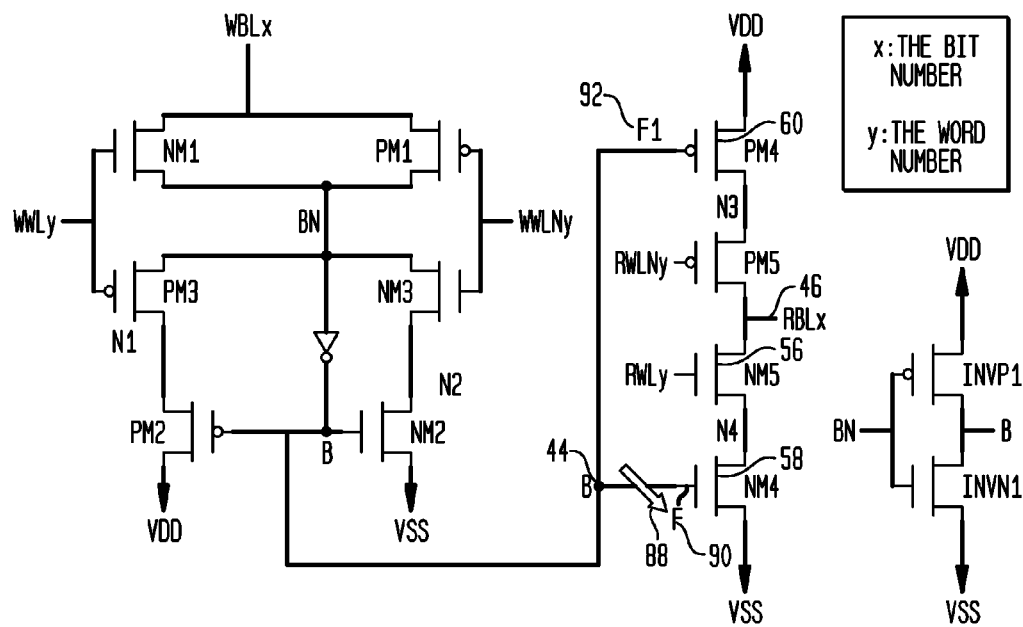
FIG. 11 is a transistor-level schematic of a single cell in the latch-based array shown in FIG. 2 showing one or more faults.

FIG. 11 shows a gate of NM4 58 stuck-open highlighted by an arrow 88. A node F 90 is a fault site that is connected to node B 44 in a fault-free circuit. In order to detect this fault, the node F 90 is pre-charged to 0 by writing logic 1 into the faulty cell. Writing WBLx=0 into the cell changes node B 44 to 1. This will turn transistor NM4 58 on, and if transistor NM5 56 is turned on by applying RWLy=1, the read out value at node RBLx 46 changes to 0 in a fault-free circuit. However, the faulty circuit F 90 retains its value 0 due to the open fault. Initial value RBLx=1, which is faulty, will be read. Therefore, the detection condition of this fault is initializing the faulty cell to 1 followed by writing 0.

In a resistive SOP fault, the faulty node F 90 will slowly charge to a fault-free value of 1. The charging rate depends on the open resistance. The smaller the resistance, the faster node F 90 will charge. Thus, to detect this fault with a smaller resistance, the duration between write and read operations should be reduced and thus fast back-to-back write and read operation should be used.

In the write-through operation, the data written into the address location is read out simultaneously. This is considered to be the fastest back-to-back write and read. Therefore, the faulty cell should be initialized with the fault described above to 1. This is followed by writing 0 and simultaneously performing a read operation. Similarly, a stuck-open fault at the gate of PM4 60 (the faulty node being F1 92 in FIG. 11) is detected by writing-through 1 after the faulty cell is initialized to 0.

After step 9 in FIG. 7, all address locations of the latch-based array contain data pattern FFH. Since the last write operations occurred in step 8, it can safely be assumed that the duration between steps 8 and 10 is long enough to set the appropriate initial conditions on the faulty nodes. Larger arrays require a longer duration between steps 8 and 10. To increase the test count, the values stored in the array from steps 8 and 9 are used as initial values. Step 10 in FIG. 7 is added, which will write data pattern 00H to latch cells and simultaneously read and compare the output of the cells. After this step, all address locations are initialized to data pattern 00H. Step 11 is added to write-through data pattern FFH to detect additional SOPs that need a fast write of FHH and a fast read.

The additional detected latch-based array internal faults can affect the functional mode of operation. For example, if the inverse of a stored value is written into a faulty cell, and the faulty cell is accessed by a read operation shortly after it is written, the incorrect value could be read and used.

Table 3 below summarizes simulation results for the augmented latch-based array scan test at 125° C., which includes 24 SAFs, 36 SOP faults, 66 bridging faults internal to target latch cell 66 and 1152 inter-BFs simulated one at a time. The number of faults detected by the new tests, with the corresponding percentage, is shown in row 2 of Table 3. Applying steps 7 and 9 once at 125° C. is adequate to charge/discharge the latch-based array. However, if the test temperature is 250° C., two pseudo write steps (applying steps 7 and 9 twice) are used to achieve the same fault coverage. Comparing the results to row 2 of Table 1, the fault coverage is doubled for SOPs and increased by about 0.5% for inter-BFs. However, some faults are still left undetected.

The simulation results shown in row 2 of Table 3 imply that 1 SAF, 6 SOP faults, 15 BFs internal to the latch cell, and another 172 inter-BFs remain undetected. These undetected faults do not affect the functional mode of operation. Thus, redundant faults are shown in row 3 of Table 3.

TABLE 3

|  | SAFs | SOPs | Intra-BFs | Inter-BFs |
| --- | --- | --- | --- | --- |
| Detect | 23/24 (95.8%) | 30/36 (83.3%) | 51/66 (77.3%) | 980/1152 (85.1%) |
| Redundant | 1/24 (4.2%) | 6/36 (16.7%) | 15/66 (22.7%) | 172/1152 (14.9%) |

Figure 12:
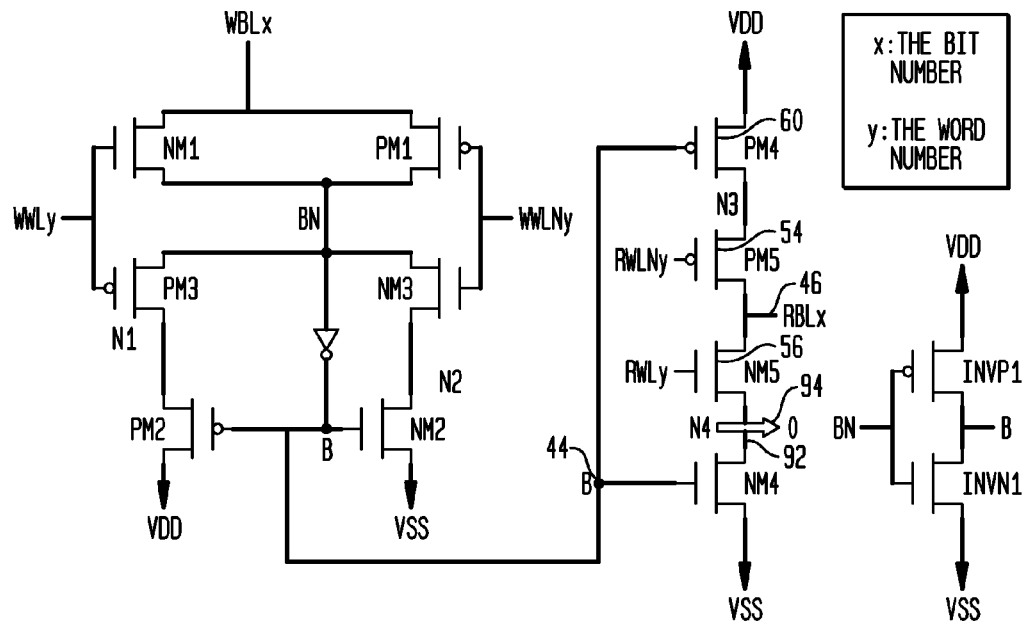
FIG. 12 is a transistor-level schematic of a single cell in the latch-based array shown in FIG. 2 showing one or more faults.

Regarding a node N4 92 stuck-at-0 fault shown in FIG. 12, the fault site is highlighted by an arrow 94. To detect this fault, 1 is written into the cell and read out. In the fault-free circuit, node B 44 stores the value 0 and turns transistor PM4 60 on. Logic value 1 will be read out during the read operation since RWLNy=0 turns PM5 54 on. In the faulty circuit, the output of node RBLx 46 is driven by both VDD through transistors PM4 60, PM5 54, and node N4=0 through node NM5 56. However, the driving strength from VDD is greater than N4=0. Therefore, this fault is not detected and does not affect the functional mode of operation.

Figure 13:
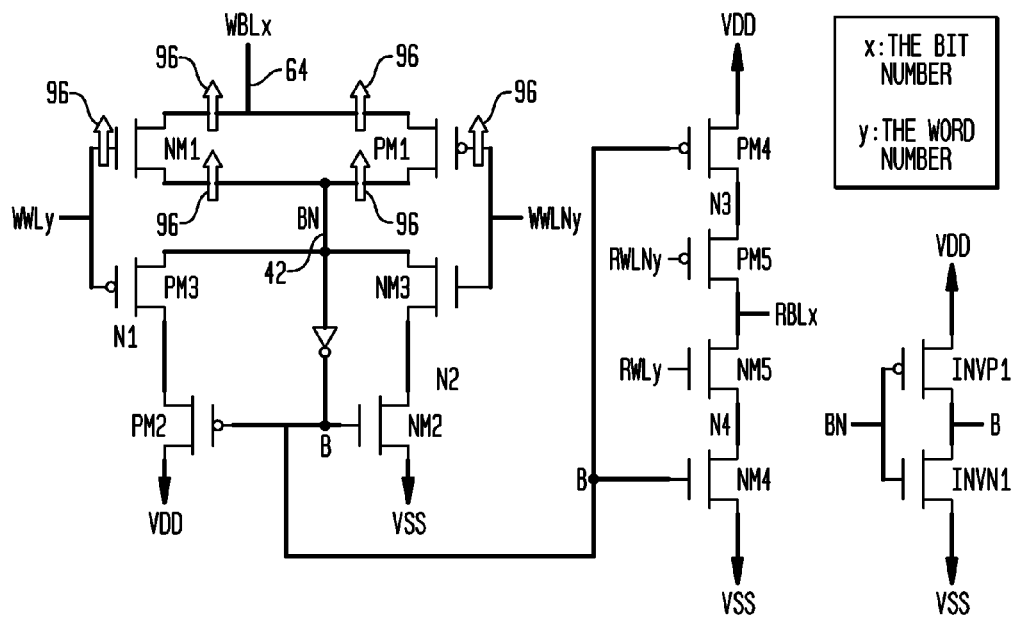
FIG. 13 is a transistor-level schematic of a single cell in the latch-based array shown in FIG. 2 showing one or more faults.

FIG. 13 shows 6 undetected SOP faults denoted by arrows 96. These faults reside in transistors NM1 38 and PM1 40, and are undetected since one of PM1 38 and NM1 40 is defective and the remaining transistor can still propagate the value from nodes WBLx 64 to BN 42. Thus, these undetected faults do not affect the functional mode of operation.

Figure 14:
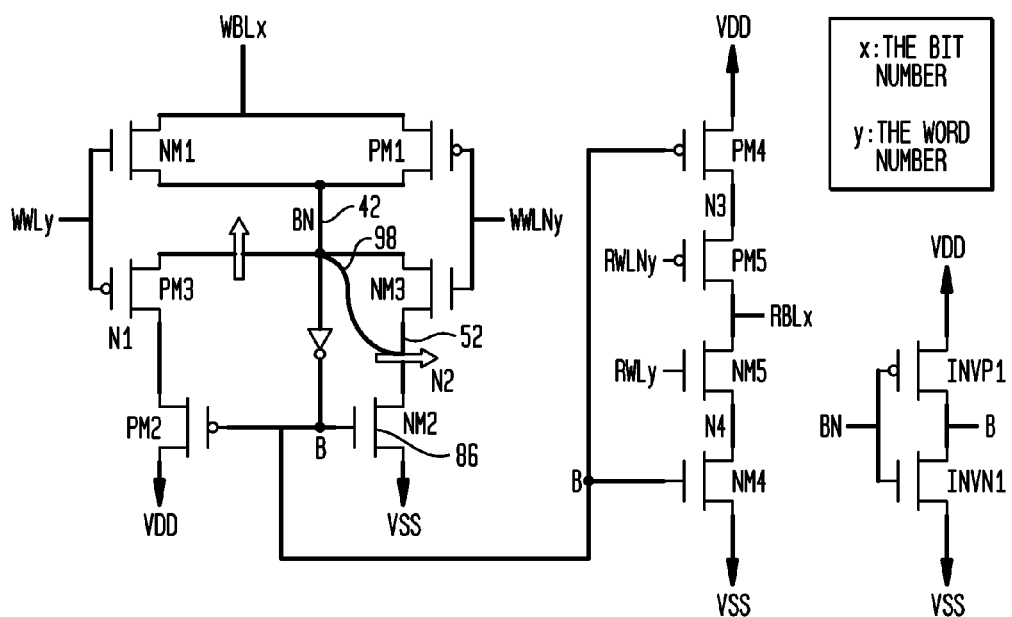
FIG. 14 is a transistor-level schematic of a single cell in the latch-based array shown in FIG. 2 showing one or more faults.

An example of an undetected bridging fault is shown in FIG. 14. This intra-bridging fault BN-N2 is indicated by a line 98 connecting nodes BN 42 and N2 52. The detection condition of bridging faults is to set different logic values on the bridged nodes. However, this condition is not satisfied since nodes BN 42 and N2 52 always store the same value during any operations. When a 0 is written to the cell, BN=0 and B=1. Transistor NM2 86 is on and hence N2=0. If logic 1 is written, BN=0 and NM2 86 is off. Thus, node N2 52 is floating and a faulty value is not generated. Similarly, during read operations, nodes BN 42 and N2 52 retain the same value from the previous write operation. Therefore, this bridging fault cannot be detected and does not generate functional errors.

The discussion above involves the detection of internal faults in the latch-based array of a small embedded memory. Since memory BIST schemes increase the area overhead quite significantly compared to this small embedded memory, scan testing is used. As indicated above, the original test set used to detect latch cell boundary TDFs does not provide comprehensive fault coverage of all latch-based array internal faults. However, the augmented boundary TDF scan test addresses the coverage gap. That is, all internal faults, except those not affecting the functional mode of operation, are detected by the augmented latch-based array scan tests shown in FIGS. 7a-b, which also include retention tests.

A design-for-test (DFT) scheme is provided herein that tests latch-based memories using scan patterns. These embodiments decrease the quantity of additional scan flip flops and two-input multiplexers required in conventional devices and methods for multiport memories. So-called "victim ports," which are described in more detail below, are used to target read ports that are being stressed. Modifications to conventional test sequences are also shown in FIGS. 17a-b. The embodiments are useful for effective testing of high-speed register files, of which latch-based register access memory (LBRAM) and micro register files (MRFs) are two examples. These files are used as embedded memory. Unlike small-signal memory cells, these files are based on custom latch-like cells.

Figure 15:
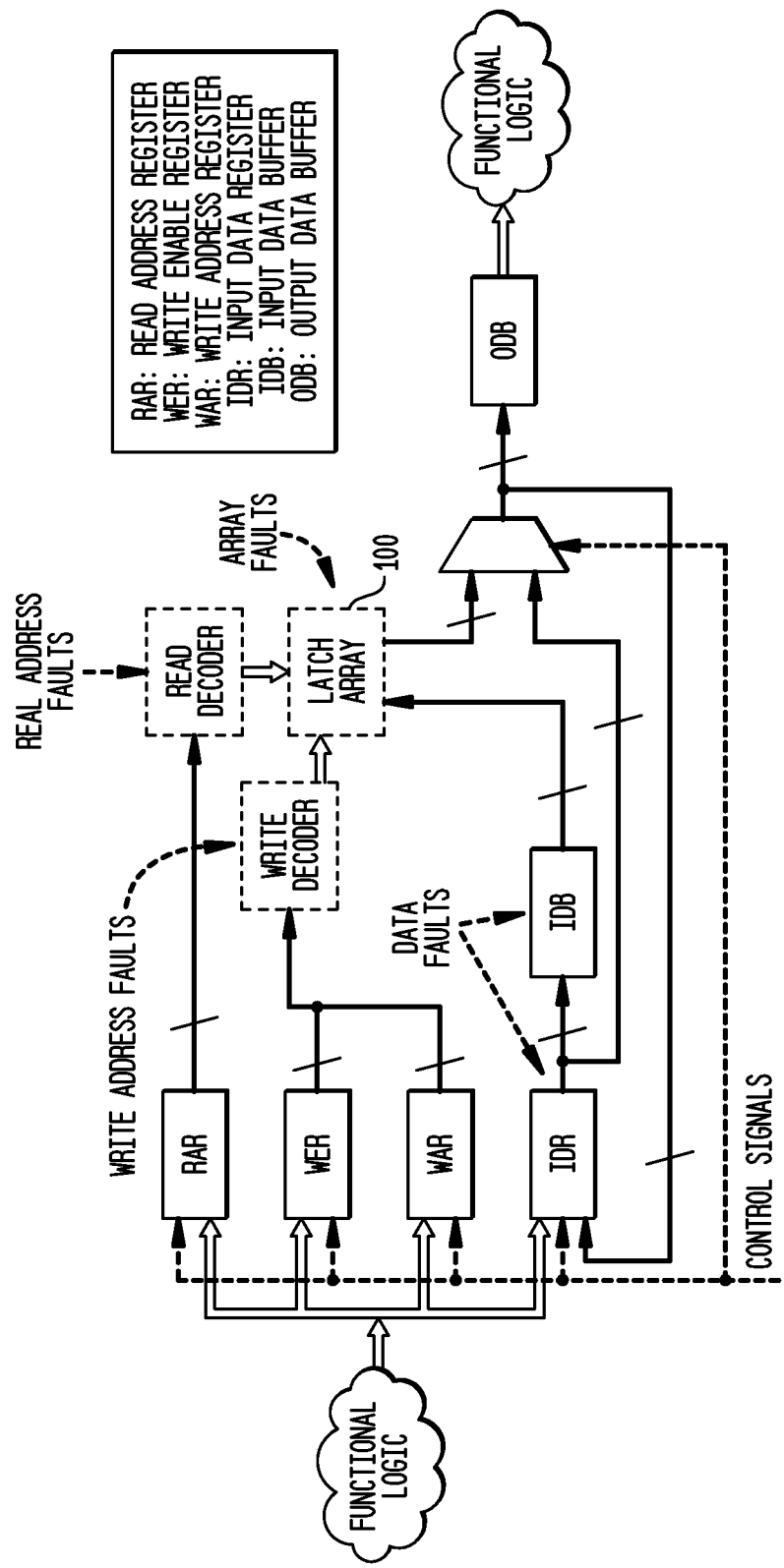
FIG. 15 is a block diagram of a one read-port, one write-port latch-based register file.

A block diagram of a one read-port, one write-port (1R1W) latch-based register array 100 is shown in FIG. 15. In F. Yang, S. Chakravarty, "Testing of Latch-based Embedded Arrays using Scan Tests," *IEEE International Test Conference*, 2010 discussed above and incorporated herein by reference, a test sequence is shown to test the latch-based array 100 shown in FIG. 15 for a variety of defects. The test sequence is shown in FIGS. 7a-b.

Figure 16:
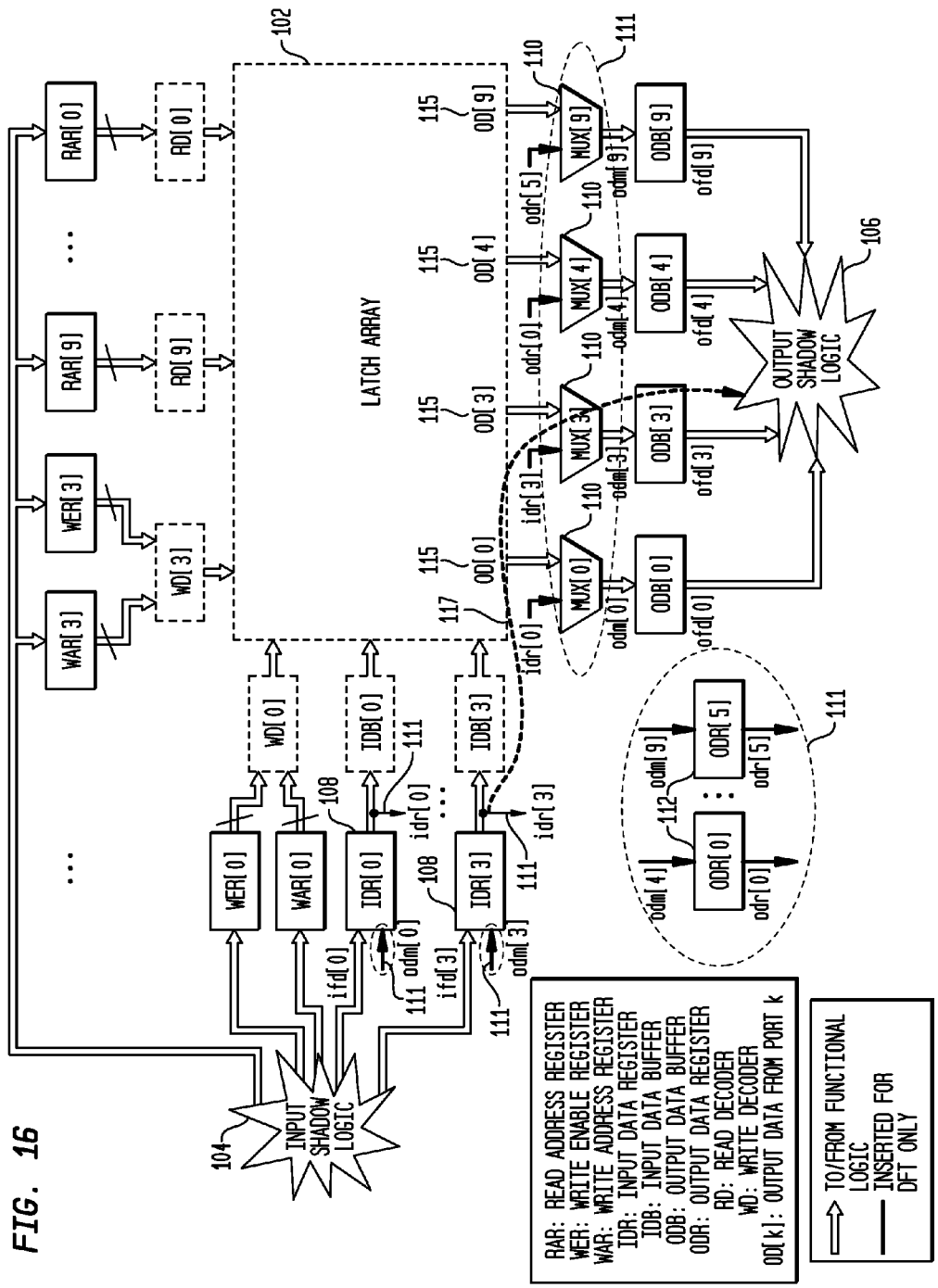
FIG. 16 is a block diagram of a 10 read port, 4 write port (10R4W) register file array.

Current designs, such as scalable processor architecture (SPARC) designs, use small, multiport embedded memories. For at least this reason, the single read-port, single write-port (1R1W) register file array has been redesigned to accommodate multiple read and write ports. 8R4W (8 read ports and 4 write ports), 10R4W (10 read ports and 4 write ports), 6R1W (6 read ports and 1 write port) are referred to as exemplary designs herein. A block diagram of an illustrative 10R4W array 102 is shown in FIG. 16. Multiple read/write decoders, input registers, multiplexer banks (one for each read port), and output data registers, are used as DFT registers. Input shadow logic 104 is functional logic that drives input of the memory array 102. Output shadow logic 106 is functional logic that is driven by output of the memory array 102.

The illustrative embodiments described herein reduce the amount of additional chip real estate that is exclusively dedicated for use during testing. This real estate and its corresponding power consumption are often referred to as design-for-test (DFT) overhead.

Figure 18:
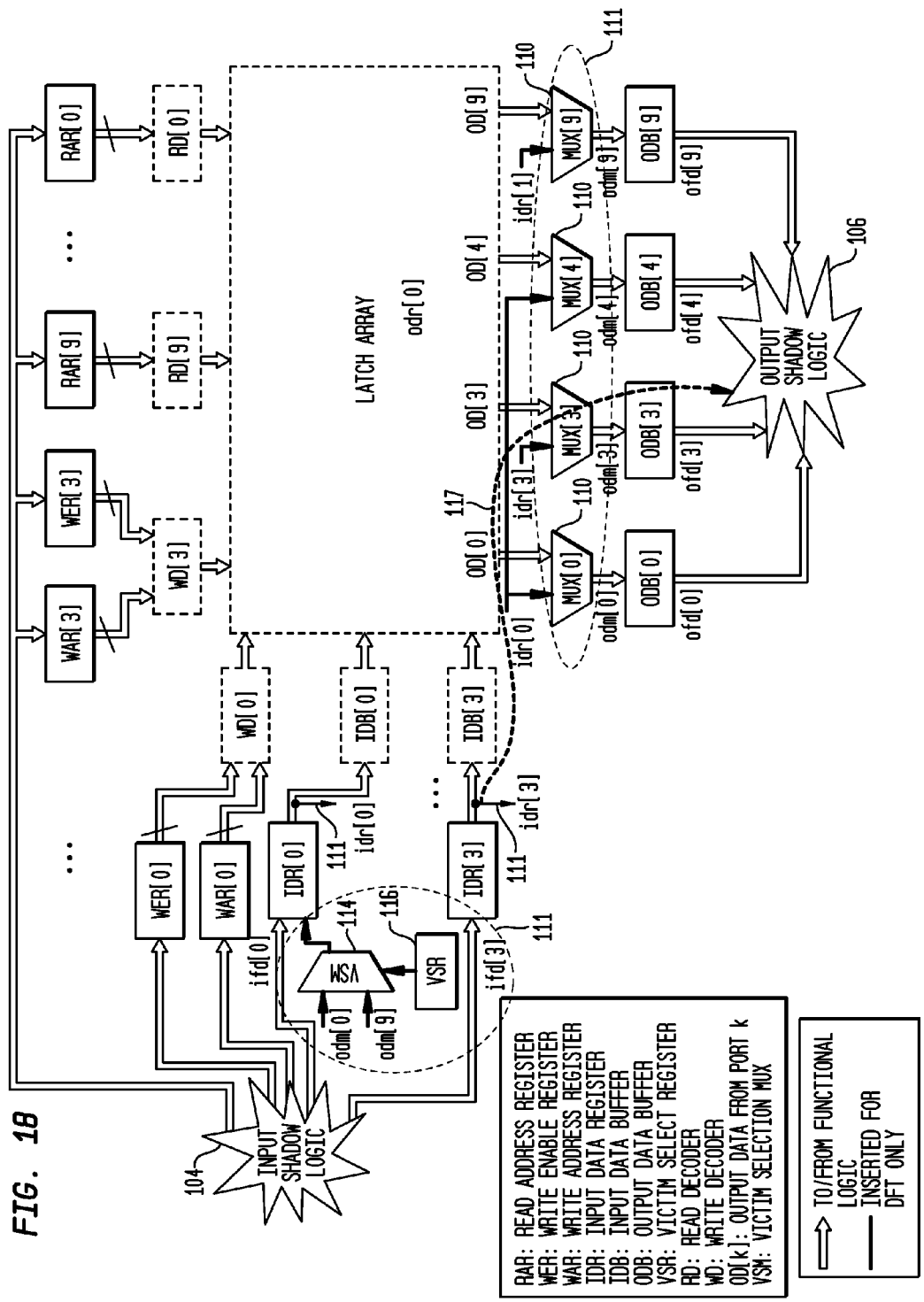
FIG. 18 is a block diagram of a 10 read port, 4 write port (10R4W) register file array modified in accordance with an embodiment of the invention.

FIGS. 16 and 18 show various components and signals associated with the DFT overhead. Since such memories are typically very wide and shallow, these memories are generally not tested using memory BIST. Rather, these memories are tested using scan patterns loaded into registers at the boundaries of these memories.

Assuming a b-bit data bus, w write ports, and r read ports, FIG. 16, shows an example in which w=4, r=10, and b=256. For input data registers IDR[0], . . . , IDR[w−1] 108, the presence of odm[0], . . . , odm[w−1], which are outputs of multiplexers MUX[0], . . . , MUX[w−1] 110, respectively, implies the need for b 2-input multiplexers since each IDR[j] has two sources from which it can load data. Thus, a two-input multiplexer within the IDR[j] block is added for this scheme and contributes to the DFT overhead. These multiplexers are operative to capture read data from ten (10) output read ports OD[0] through OD[r−1] 115 shown in FIG. 16. The cost of this DFT overhead is approximately b*w 2-input multiplexers. The b-bit output data registers ODR[0], . . . , ODR[r−w−1] 112 are used to capture read data from read ports OD[w], . . . , OD[r−1] 115. These output data registers are not used during the functional mode. The cost of this DFT overhead is approximately b*(r−w) scan flops. Output data registers ODR[0], . . . , ODR[5] 112 are registers that include flip-flops. The multiplexers MUX[0], . . . , MUX[r−1] 110 are used to support a memory bypass mode. Data is loaded into registers IDR[0], . . . , IDR[w−1] 108 and ODR[0], . . . ODR[r−w−1] 112. ODR[0], . . . , ODR[r−w−1] 112 are not used during the functional mode but are part of the scan chain. ODR[0], . . . , ODR[r−w−1] 112 capture the data read from read ports OD[w] . . . through OD[r−1] 115. The output of these registers drive output shadow logic during a scan test. One such path 117 from the output of IDR[3] through MUX [3], output data buffer ODB[3], and the output shadow logic is shown in FIG. 16. The cost of this DFT overhead is approximately b*r 2-input multiplexers. In addition to the circuitry described above, further circuitry is added to configure the various memory registers into the scan mode, support ram sequential tests, and the like, which are not explicitly shown in FIG. 16 but contribute to DFT area overhead.

Thus, the total DFT overhead is approximately b*(w+r) 2-input multiplexers +b*(r−w) scan flip-flops for the example described, in which b=256, w=4 and r=10. Therefore, the total DFT overhead is 256*14 2-input multiplexers and 256*6 scan flops, which equals 3584 2-input latches and 1536 scan flip flops. If b is decreased to 32, the DFT overhead decreases to 348 2-input latches and 192 scan flip flops. The embodiments substantially decrease DFT overhead area without sacrificing quality of the applied tests.

The embodiments are based on the notion of a so-called "victim port." To understand this concept, a multiport version of the algorithm for a one read-port, one write-port (1R1W) example will be discussed. An algorithm for multiport memories exercises all read and write ports, excites an increased coupling between the multiple ports, and does not increase the number of steps used in the 1R1W algorithm. Examples of a test sequence for different memory types are shown in FIGS. 19-22. To increase stress on the write ports, for example, when 0's are written into a given write port, 1's should be written into the remaining write ports. This can cause some of the 0 bits to be flipped, and consequently a malfunction of the write operation in the victim port. A similar technique is used for read operations.

Step 3 of an algorithm for a 10-read, 4-write port memory is replicated in FIGS. 17*a-b* to illustrate the victim port concept. Step 3 for a read victim port is shown in FIG. 17*a*. At line 6 of the algorithm, while location (i) is being read with the expected data 55H, complemented data AAH is being read from the remaining nine (9) read ports, and complemented data AAH is also being written into the memory through all write ports. In this example, read port 2 is a read victim port. Read and write test patterns are referred to using eight (8)-bit quantities, such as 55H and AAH, herein. However, it is intended that the test patterns be repeated across the width of the relevant read or write port, and/or data bus. For example, for a 16-bit read port, the test pattern could be 5555H or AAAAH Step 3 for a write victim port is shown in FIG. 17*b*. At line 7 of the algorithm, while location (i−1) is being written with data pattern 55H, complemented data AAH is being written to the remaining write ports, and complemented data is being read from the memory through all read ports. In this example, write port 3 is a write victim port. The embodiments are not limited to the test sequence given above, which was used to merely illustrate the concept of victim ports.

Features of one or more embodiments of the invention include that every read port is a read victim port in some phase of the test sequence, and every write port is a write victim port in some phase of the test sequence. Also, when a read port is a read victim port, then all words in the memory are accessed, and when a write port is a write victim port, then all words in the memory are accessed. In addition, during any read operation, the word read out via the read port is the operation that is going to fail, and during any write operation, the word written into via the write port is the operation that is going to fail. That is, the expected data will not be read out or the intended data will not be written. For the write case, this will appear as a read failure in a subsequent step. Further, in any step, the comparison that is of interest is the output of the read victim port. As a consequence, the output of the read victim port is captured. The read victim port will change from one step to the next. Thus, a means to access output from the read victim port, which is of relevance in a given step, is addressed by the embodiments.

A block diagram of the 10-read 4-write port memory structure modified in accordance with the embodiments is shown in FIG. 18. In this embodiment, the output data registers ODRs 112 shown in FIG. 16 have been removed, which results in a DFT overhead saving of b*(r−w) scan flip flops. In addition, ifd[i] inputs from all but IDR[0] 113 have been removed, which results in a DFT overhead saving of b*(w−1) 2-input multiplexers. Further, input data registers IDR[0], . . . , IDR[w−1] now drive the input of multiple MUX[k]'s 110, that is IDR[0] 113 drives the input of MUX [0] 110, MUX[w] 110, MUX[2w] 110, . . . , IDR[w−1] drives the input of MUX[w−1], MUX[2w−1] . . . which also eliminates substantial DFT gate overhead.

A virtual selection multiplexer (VSM) 114 is added that selects one of r potential read victim ports for output to IDR[0] 113. The VSM 114 includes a set of multiplexers. The number of multiplexers equals a data width of the read ports. The select signals are derived from a virtual selection register (VSR) 116 that determines, in any given step, the read port that is to be output to IDR[0] 113. The additional DFT overhead for the VSR 116 is approximately equal to $r*\log_2(r)$ 2-input multiplexers, which represents an upper bound that is in most cases much smaller. Since the output of the VSR 116 drives the select lines of the VSM 114, the VSR 116 forms a portion of a scan chain that is loaded and specified for memory read/write operations during testing. In functional mode, the value of this register is unimportant. VSM and VSR are used as follows. VSR is used to select one victim port at a time. Assuming that there are r read ports, victim ports 1, 2, 3, . . . , r are selected one at a time. This is done by loading the VSR, using the automatic test equipment, with values 1, 2, r, where r is an integer. The value in the VSR selects the victim port being tested and the value in VSR configures the VSM.

The value in the VSR also routes the data from the appropriate input to the output of the VSM. The sequence of tests for the victim read port is applied and captured at the output of the VSM.

Thus, the embodiments result in a reduction of $b*(r-w)-\log_2(r)$ scan flip-flops, and $b*(w-1)-r*\log_2(r)$ 2-input multiplexers. For example, if b=256, r=10, and w=4, 1,532 scan flip-flops and 728 2-input multiplexers are eliminated. Similarly, if b=32, r=10, and w=4, 188 scan flip-flops and 56 2-input multiplexers are eliminated. Steps in the test algorithm used with an embodiment for an 8R2W (8-read port, 10-write port) memory (not shown) are shown in FIGS. 19a-c.

Thus, the embodiments herein are used wherever multiport latch-based memories are used. Although the embodiments are in relation to scan-based testing, the same concepts are used for memories tested using memory BIST.

The test sequence for one-read, one-write port memories can be used for multiport register files by repeating the test sequence for each pair of read/write ports. However, this approach requires a very long test sequence that does not test for port coupling faults. The thirteen (13) step sequence shown in FIGS. 7a-b can be applied using either scan patterns or memory BIST. In steps 1, 6, and 8, each memory location is accessed once. For the remaining steps, each memory location is accessed twice, once for a read operation and once for a write operation. Thus, this algorithm is a 23N algorithm, where N is the number of words in the memory array. Since all read and write ports are exercised, for a memory with w write ports and r read ports, where r>w, the multi-port algorithm would be 23*N*w+N. The last N is for a simultaneous read of the read ports that were not exercised. Memories that are wide, which are memories that have a large number of bits, and shallow, which are memories that have a small number of words, are often tested using scan tests to avoid the area overhead of BIST. In such a scenario, 23wN+N scan loads are used. For example, if N=256, w=4, and r=10, 23,552 scan loads would be used, which is much larger than the number of TDF scan patterns used to test the entire logic circuit. In the embodiments, the concepts discussed above are addressed with a test sequence that is as large as the original test sequence used for the one-read, one write-port register file.

In one embodiment, the test sequence d is as large as the original test sequence for the one-read, one-write port register file, that is, 24N. This test sequence embodiment exercises all read and write ports, and excites increased coupling between the multiple ports. This sequence is based on the concepts of a write victim port and a read victim port. That is, if word[k] is read from read a victim port, and if data pattern "d" is being read from word[k], then read data pattern "~d" (which is the bit-wise complement of d) is simultaneously read from all other read ports. Also, if word[k] is written into write victim port, and if data pattern "d" is written into word[k], then write data pattern "~d" is simultaneously written to all other write ports and "~d" is read from all other read ports. Further, in each step of the sequence, every port in memory becomes a write victim port and a read victim port at least once. All ports are exercised by rotating the read and write ports in a daisy-chain fashion during different steps of the test sequence. Care is also taken to exercise the write enable registers for each write port. Specific test sequences for three different cases are shown in FIGS. 19-22.

FIG. 23 is a block diagram of an embodiment of a machine in the form of a computing system 200, within which is a set of instructions 202 that, when executed, cause the machine to perform any one or more of the methodologies herein. In some embodiments, the machine operates as a standalone device. In some embodiments, the machine are connected (e.g., via a network 222) to other machines. In a networked implementation, the machine operates in the capacity of a server or a client user machine in a server-client user network environment. The machine includes a server computer, client user computer, personal computer (PC), tablet PC, Personal Digital Assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 200 includes a processing device(s) 204 (e.g., a central processing unit (CPU), a graphics processing unit (GPU), or both), program memory device(s) 206, and data memory device(s) 208, which communicate with each other via a bus 210. The computing system 200 further includes display device(s) 212 (e.g., liquid crystals display (LCD), flat panel, solid state display, or cathode ray tube (CRT)). The computing system 200 includes input device(s) 214 (e.g., a keyboard), cursor control device(s) 216 (e.g., a mouse), disk drive unit(s) 218, signal generation device(s) 220 (e.g., a speaker or remote control), and network interface device(s) 224, operatively coupled together, and/or with other functional blocks, via bus 210.

The disk drive unit(s) 218 includes machine-readable medium(s) 220, on which is stored one or more sets of instructions 202 (e.g., software) embodying any one or more of the methodologies or functions herein, including those methods illustrated herein. The instructions 202 also resides, completely or at least partially, within the program memory device(s) 206, the data memory device(s) 208, and/or the processing device(s) 204 during execution thereof by the computing system 200. The program memory device(s) 206 and the processing device(s) 204 also constitute machine-readable media. Dedicated hardware implementations, such as but not limited to application specific integrated circuits, programmable logic arrays, and other hardware devices can likewise be constructed to implement the methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 202, or that which receives and executes instructions 202 from a propagated signal so that a device connected to a network environment 224 can send or receive voice, video or data, and to communicate over the network 224 using the instructions 202. The instructions 202 are further transmitted or received over the network 224 via the network interface device(s) 222 The machine-readable medium also contain a data structure for storing data useful in providing a functional relationship between the data and a machine or computer in an illustrative embodiment of the systems and methods herein.

While the machine-readable medium 202 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions or logic herein, are optionally stored on a tangible storage medium, such as: a magnetic medium, such as a disk or tape; a magneto-optical or optical medium, such as a disk; or a solid state medium, such as a memory card or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiment are not limited to such standards and protocols.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments of the inventive subject matter are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus the following claims are hereby incorporated into the Detailed Description, with each claim standing on its own as a separate example embodiment.

The Abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings of the invention provided herein, one of ordinary skill in the art will be able to contemplate other implementations and applications of the techniques of the invention. Although illustrative embodiments of the invention have been described herein with reference to the accompanying drawings, it is to be understood that the invention is not limited to those precise embodiments, and that various other changes and modifications are made therein by one skilled in the art without departing from the scope of the appended claims.

What is claimed is:

1. A multiport latch-based memory device, comprising:
   a latch array responsive to output data from an input data register in a functional mode associated with the latch-based memory device;
   a plurality of first multiplexers responsive to output data from the latch array in the functional mode, the plurality of first multiplexers being responsive to output data from the input data register in a test mode associated with the latch-based memory device; and
   a second multiplexer selectively providing output data from the plurality of first multiplexers to the input data register in the test mode, thereby providing a data path bypassing the latch array in the test mode.

2. The multiport latch-based memory device defined by claim 1, further comprising a selection register, the second multiplexer selectively providing output data from the plurality of first multiplexers to the input data register based on output data from the selection register in the test mode.

3. The multiport latch-based memory device defined by claim 1, further comprising input shadow logic, the input data register being responsive to output data from the input shadow logic in the functional mode.

4. The multiport latch-based memory device defined by claim 1, further comprising output shadow logic, the output shadow logic being responsive to output data from the plurality of first multiplexers in the functional mode.

5. The multiport latch-based memory device defined by claim 1, wherein the multiport latch-based memory device is configured to perform a read victim port operation in the test mode.

6. The multiport latch-based memory device defined by claim 5, wherein the read victim port operation comprises reading a data pattern from a first read port simultaneously with reading a bit-wise complement of the data pattern from a second read port, the first read port and the second read port being associated with the latch array, the first read port being a read victim port.

7. The multiport latch-based memory device defined by claim 1, wherein the multiport latch-based memory device is configured to perform a write victim port operation in the test mode.

8. The multiport latch-based memory device defined by claim 7, wherein the write victim port operation comprises:
   writing a data pattern to a first write port simultaneously with writing a bit-wise complement of the data pattern to a second write port, the first write port and the second write port being associated with the latch array, the first write port being a write victim port; and
   reading the bit-wise complement of the data pattern from a second read port.

9. A method of testing a multiport latch-based memory device, comprising:
   providing a latch array responsive to output data from an input data register in a functional mode associated with the latch-based memory device;
   providing a plurality of first multiplexers responsive to output data from the latch array in the functional mode, the plurality of first multiplexers being responsive to output data from the input data register in a test mode associated with the latch-based memory device; and
   providing a second multiplexer selectively providing output data from the plurality of first multiplexers to the input data register in the test mode, thereby providing a data path bypassing the latch array in the test mode.

10. The method of testing a multiport latch-based memory device defined by claim 9, further comprising providing a selection register, the second multiplexer selectively providing output data from the plurality of first multiplexers to the input data register based on output data from the selection register in the test mode.

11. The method of testing a multiport latch-based memory device defined by claim 9, further comprising providing input shadow logic, the input data register being responsive to output data from the input shadow logic in the functional mode.

12. The method of testing a multiport latch-based memory device defined by claim 9, further comprising providing output shadow logic, the output shadow logic being responsive to output data from the plurality of first multiplexers in the functional mode.

13. The method of testing a multiport latch-based memory device defined by claim 9, further comprising configuring the multiport latch-based memory device to perform a read victim port operation in the test mode.

14. The method of testing a multiport latch-based memory device defined by claim 13, wherein the read victim port operation comprises reading a data pattern from a first read port simultaneously with reading a bit-wise complement of the data pattern from a second read port, the first read port and the second read port being associated with the latch array, the first read port being a read victim port.

15. The method of testing a multiport latch-based memory device defined by claim 9, further comprising configuring the multiport latch-based memory device to perform a write victim port operation in the test mode.

16. The method of testing a multiport latch-based memory device defined by claim 15, wherein the write victim port operation comprises:
   writing a data pattern to a first write port simultaneously with writing a bit-wise complement of the data pattern to a second write port, the first write port and the second write port being associated with the latch array, the first write port being a write victim port; and
   reading the bit-wise complement of the data pattern from a second read port.

* * * * *